United States Patent [19]

Knox

[11] Patent Number: 5,784,388

[45] Date of Patent: Jul. 21, 1998

[54] METHODS AND APPARATUS FOR DECODING CONTROL SIGNALS IN DISPATCH TRUNKED RADIO SYSTEM

[76] Inventor: Gregory D. Knox, 1417 Red Fox Run, Lilburn, Ga. 30247

[21] Appl. No.: 582,654

[22] Filed: Jan. 4, 1996

[51] Int. Cl.[6] ............................................. H03M 13/00
[52] U.S. Cl. ........................................ 371/37.5; 371/32
[58] Field of Search ........................... 371/37.5, 39.1, 371/47.1; 370/277, 462; 455/17, 7, 33.1, 101; 198/447

[56] References Cited

U.S. PATENT DOCUMENTS

| | | | |
|---|---|---|---|
| Re. 32,789 | 11/1988 | Lynk et al. | 379/58 |
| 3,882,457 | 5/1975 | En | 340/146.1 |
| 4,012,597 | 3/1977 | Lynk, Jr. et al. | 179/41 A |
| 4,055,832 | 10/1977 | En | 340/146.1 |
| 4,059,825 | 11/1977 | Greene | 371/39.1 |
| 4,225,960 | 9/1980 | Masters | 371/47.1 |
| 4,253,193 | 2/1981 | Kennard et al. | 455/101 |
| 4,271,520 | 6/1981 | Coombes et al. | 371/42 |
| 4,312,070 | 1/1982 | Coombes et al. | 371/40 |
| 4,347,625 | 8/1982 | Williams | 371/17 |
| 4,360,927 | 11/1982 | Bowen et al. | 455/17 |
| 4,399,555 | 8/1983 | MacDonald et al. | 455/33.1 |
| 4,409,687 | 10/1983 | Berti et al. | 455/7 |
| 4,553,262 | 11/1985 | Coe | 198/447 |
| 4,612,415 | 9/1986 | Zdunek et al. | 179/2 EB |
| 4,651,316 | 3/1987 | Kocan et al. | 370/462 |
| 4,672,601 | 6/1987 | Ablay | 370/277 |
| 4,692,945 | 9/1987 | Zdunek | 455/17 |
| 4,723,264 | 2/1988 | Sasuta et al. | 379/58 |
| 4,837,858 | 6/1989 | Ablay et al. | 455/34 |
| 5,060,296 | 10/1991 | Grube et al. | 455/218 |
| 5,230,078 | 7/1993 | Varela et al. | 455/67.1 |

*Primary Examiner*—Reba I. Elmore
*Assistant Examiner*—McDieunel Marc
*Attorney, Agent, or Firm*—Wolf, Greenfield & Sacks, P.C.

[57] ABSTRACT

A system for decoding encoded data from the control channel of a trunked dispatch system, and for detecting the presence of subaudible handshake data on an assigned voice channel of the trunked dispatch system. The decoder includes a de-interleave, an auto synchronization sequence combiner, and a table lookup error detector to recover the transmitted information and also indicates whether any errors are present in the recovered information. The subaudible handshake detector includes a comparator/limiter, a data sampler, a pattern matcher, and a signal/noise discriminator to indicate the presence of the subaudible handshake on an assigned voice channel of the trunked dispatch system.

21 Claims, 14 Drawing Sheets

FIG. 2
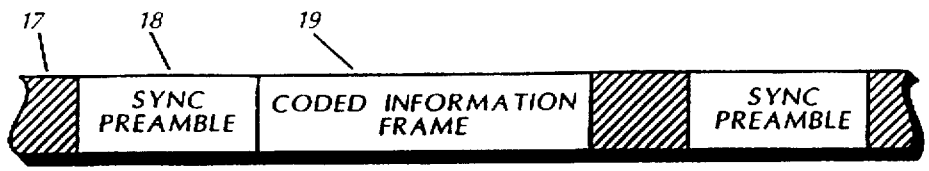
FIG. 3 PRIOR ART ENCODER
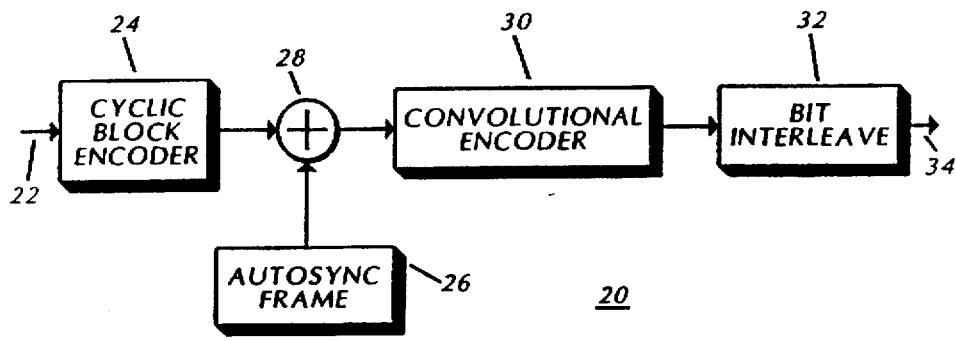
FIG. 4 PRIOR ART DECODER
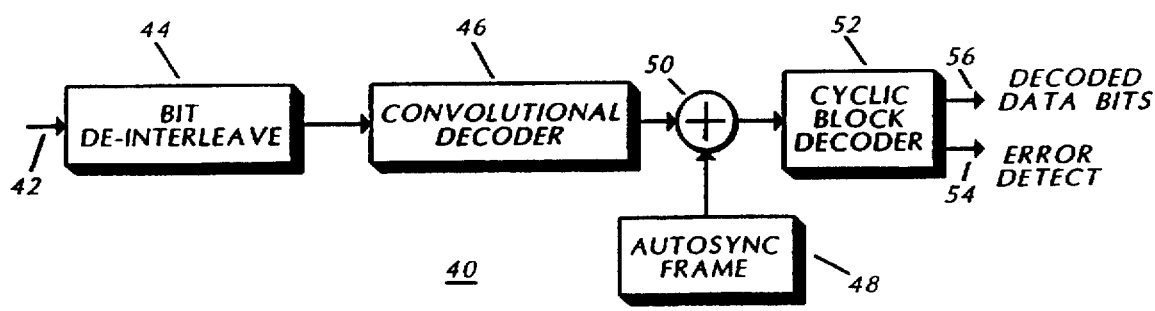
FIG. 5
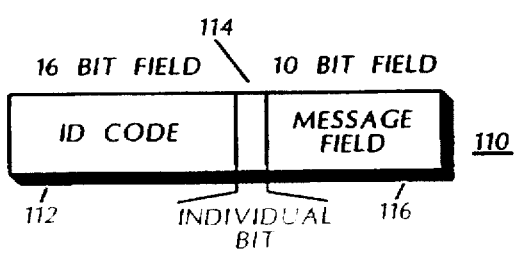

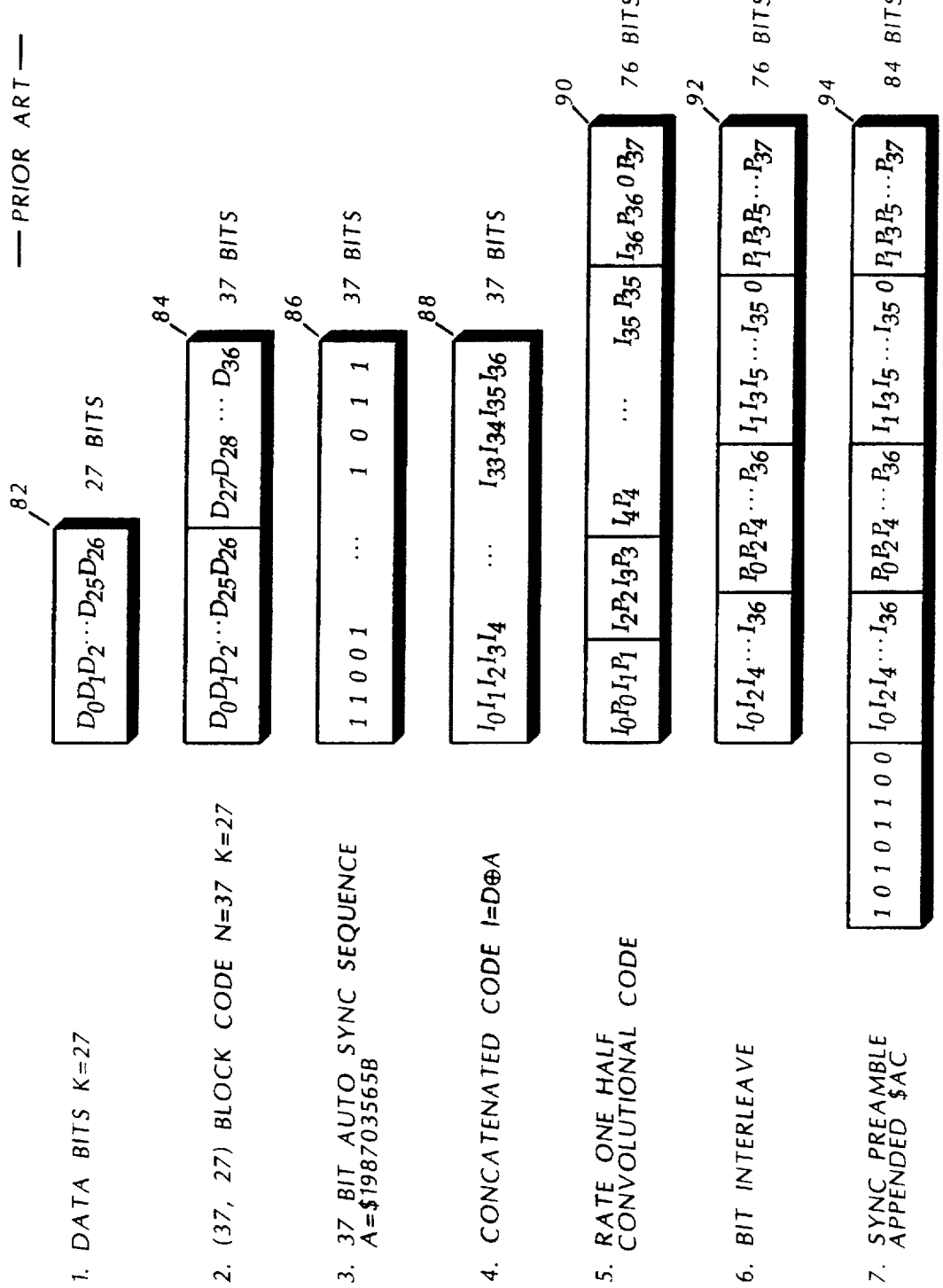

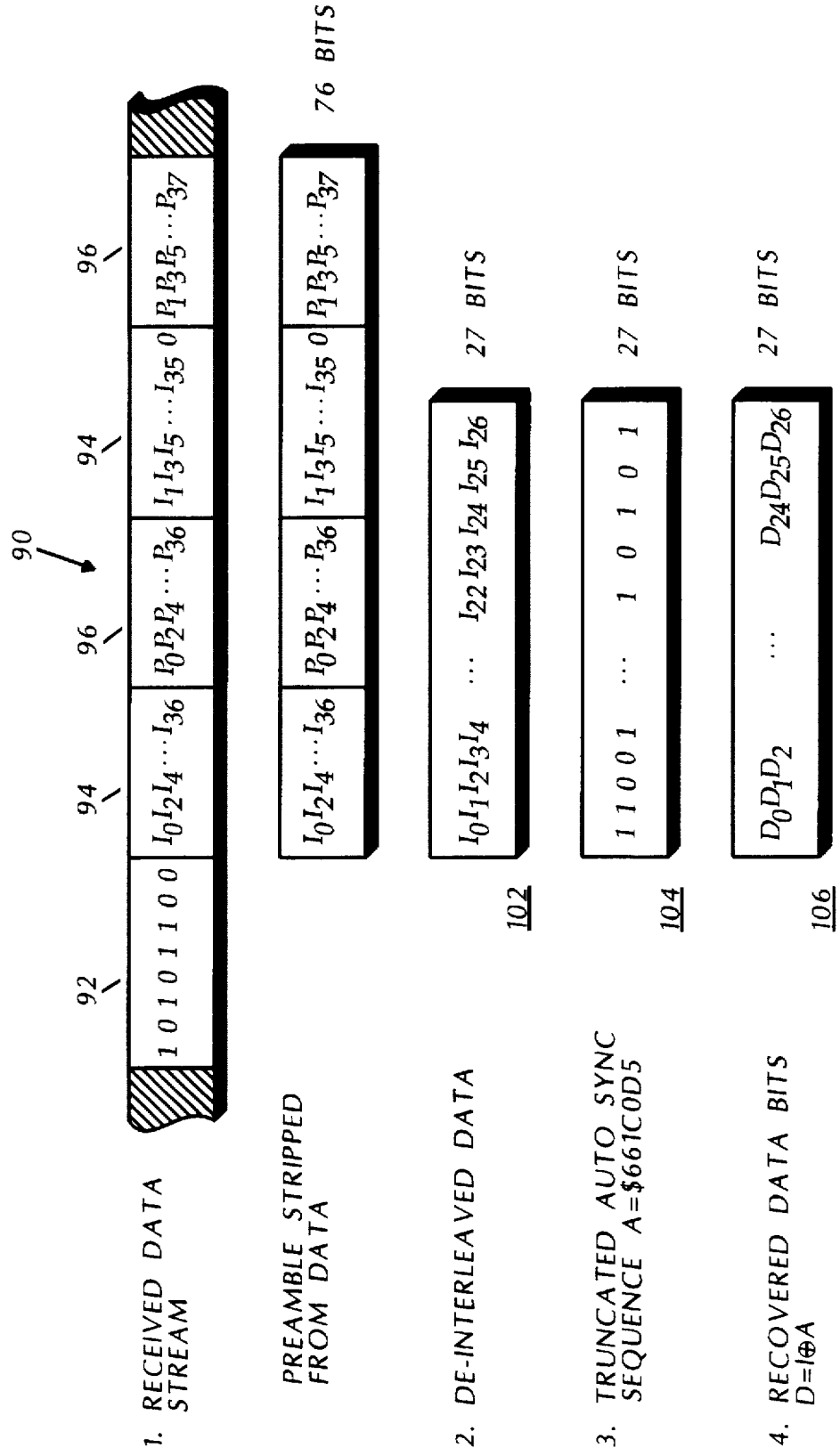

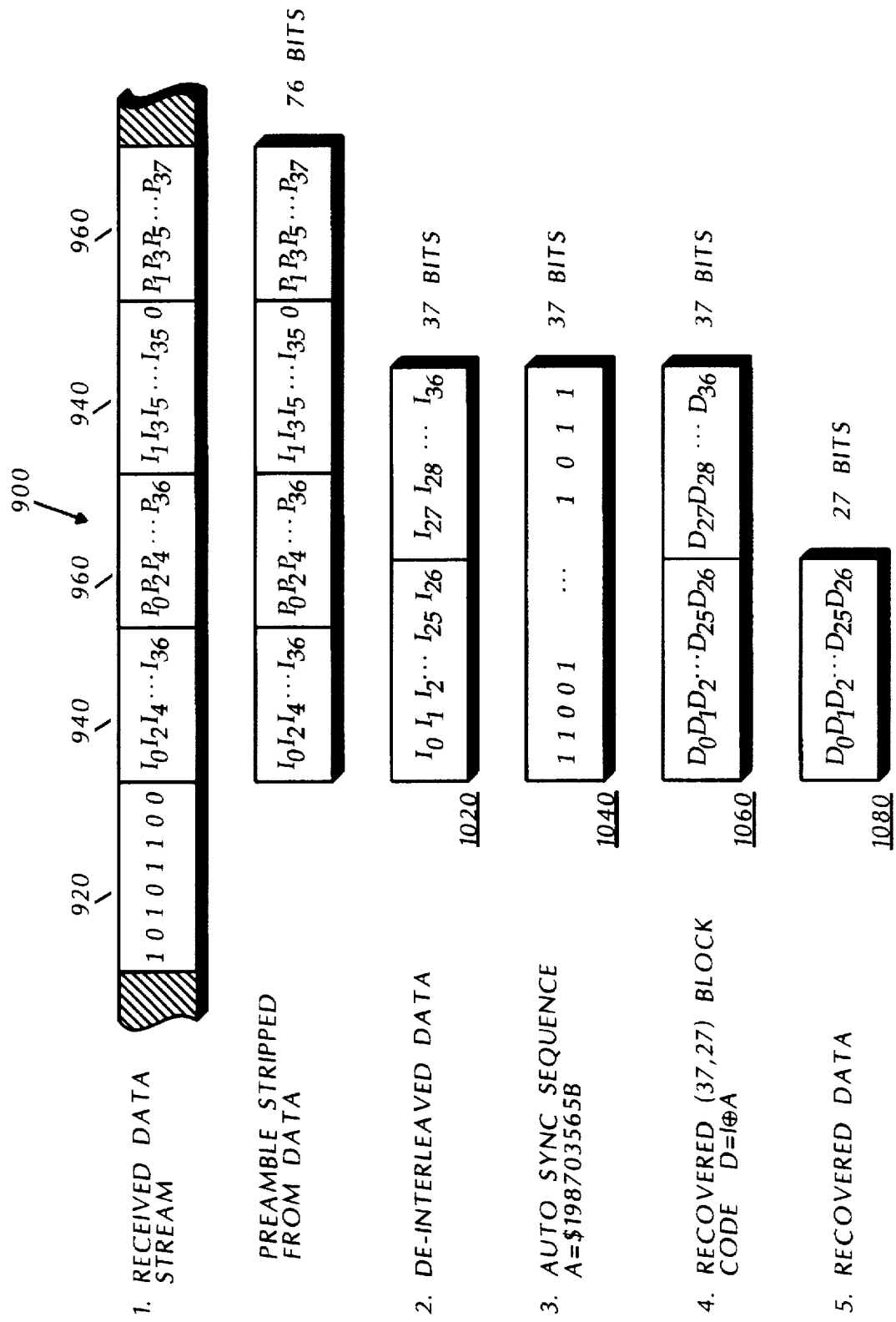

— PRIOR ART —

METHODS AND APPARATUS FOR DECODING CONTROL SIGNALS IN DISPATCH TRUNKED RADIO SYSTEM

FIELD OF THE INVENTION

This invention relates generally to trunked radio systems, and, more specifically, to methods and apparatus for extracting control information from the control channel and subaudible signal portions of a dispatch trunked radio system.

BACKGROUND OF THE INVENTION

Due to their efficient use of limited frequency spectrum, dispatch trunked radio systems are becoming more common in both the private and public sectors of the marketplace. In a dispatch trunked radio system, a central controller allocates a limited number of channels among many users. Generally, within a trunked system, the many users are organized into fleets, sub-fleets or groups and individuals. Each user is assigned a fleet, sub-fleet, and individual (ID) code or, depending upon the system variant, only an individual (ID) code, which is linked to one or more talk groups. Since there are many more users than channels, users must request and be granted a channel before they may communicate. In a dispatch trunked radio system, a mobile radio establishes communication on the system by transmitting a channel request to the system central controller on a predetermined inbound frequency. The central controller responds to the mobile unit with a signaling word commonly referred to as an OSW, (outbound signal word), which authorizes the mobile unit to operate on a specific channel. Typically, the channel request generated by the mobile unit includes information which identifies it to the central controller. The mobile unit may also respond to other commands from the central controller based on the mobile unit's ID transmitted in the OSW.

Several variants of dispatch trunked radio systems have evolved and been fielded over the years. Two prior trunked systems are described in U.S. Pat. No. 4,692,945, entitled "Dispatch Trunked Radio System," issued Sep. 8, 1987, to Zdunek and in U.S. Pat. No. 4,723,264, entitled "Signaling Method For Establishing Trunked Communication," issued Feb. 2, 1988, to Sasuta et al. Common to these variants is a method of encoding the data to be conveyed in the OSW, described in U.S. Pat. No. 4,312,070, entitled "Digital Encoder-Decoder," issued Jan. 19, 1982, to Coombes et al., in U.S. Pat. No. 4,055,832, entitled "One-Error Correction Convolutional Coding System," issued Oct. 25, 1977, to En, and in U.S. Pat. No. 4,271,520, entitled "Synchronizing Technique For An Error Correcting Digital Transmission System," issued Jun. 2, 1981, to En. This encoding technique takes the 27 data bits which actually contain the control information needed by the mobile receiver, and through a series of operations described in the previously cited patents, expands the data to an 84 bit data frame which is transmitted as the OSW. This encoding scheme affords a very high level of reliability and signal integrity appropriate for a subscriber's mobile unit requiring a transmit and receive capability on a dispatch trunked radio system. A radio directed to the wrong channel as a result of an incorrectly decoded OSW could compromise the operation of the trunked system. Additionally, the mobile unit may miss communications intended for it, as well as interfere with communications directed at other units. In critical public safety communications systems, the need for proper operation is even more important.

In addition to the encoding of the OSW, there are other "handshaking protocols" that occur between the mobile unit and the central controller. These are described in the aforementioned U.S. Pat. No. 4,692,945. A "High Speed Handshake," "High Speed Acknowledge," "Voice/Low Speed Acknowledge," "Voice/Low Speed Handshake," "Mobile Disconnect," and "Central Disconnect" are all described. Together with the error correction and encoding afforded the OSW, mobile units are all but certain to operate only on the assigned channel. All of these techniques, while necessary for a subscriber unit to operate reliably, involve excessive processing overhead for the case where it is only desired to listen to and follow conversations on the trunked system.

It is often desirable to be able to listen to various agencies and users of a communication system, but without any capability for transmitting. Non-trunked communication systems are easily monitored with a variety of radio communication receivers. One example of this type of radio is a "scanner". Scanners are radio receivers that typically cover a range of frequencies between approximately 30 MHz and 1 GHz. The receiver is sequentially tuned among a predetermined number of user selected frequencies (scanning), in search of a signal. If a signal is detected, the scanner stops scanning and remains tuned to the active frequency until the signal ceases, whereupon the scanning action resumes. The typical scanner comprises a receive-only radio without any capability for transmitting. However, scanner type receivers have also been incorporated in some transceivers, thereby providing the user with the option of listening to and scanning frequencies outside the range the user is authorized to transmit on. Such receivers are inexpensive and enable the user to hear the agency or agencies desired with little effort on the part of the user and little or no effort on the part of the communications systems operator. However, a conventional receiver such as a scanner is not able to follow a conversation taking place on a dispatch trunked radio system. As pauses occur in the conversation, the channel assigned to the participants changes in a more or less random fashion. This makes it difficult for the scanner to find the channel to which the conversation has moved, as the scanner will simply look for the next channel with activity on it. Since there may be many conversations occurring on the trunked system at once, it is unlikely that the scanner will move to the correct channel. Consequently, providing a receive only capability for trunked systems is typically accomplished by providing a mobile unit designed and programmed to operate on the trunked system but with its transmit capability disabled. This entails the purchase of a very expensive transceiver of limited availability, and requires the system operator to provide for the programming of the radio. Heretofore, it has not been thought possible by most radio manufacturers to economically produce a receiver capable of tracking conversations on a trunked system. This is due in large part to the excessive complexity of the signaling protocol relative to the pricing of a typical receiver. Additionally, the requirement for low cost in a conventional scanner, for instance, limits the level of sophistication its microprocessor possesses. Consequently, the data processing overhead required to implement the decoding of the OSW has prevented its implementation in an inexpensive receiver.

In addition to the OSW, the subaudible handshake data present on the voice channel must also be decoded. This step requires the inclusion of special purpose filter circuitry which is an additional expense mitigating against the manufacture of a receiver capable of receiving and tracking dispatch trunked radio systems. Conventional scanners provide a squelch circuit to detect the cessation of activity on a selected frequency and resume searching for active frequencies. A squelch circuit could be used instead of the subaudible handshake to detect the end of a conversation on the voice channels of a trunked system. However, this technique does not always work reliably, since many trunked systems do not remove the carrier from the previously active voice channel until several seconds after voice activity has ceased on that channel. A conventional squelch circuit detects the presence of a carrier and therefore will not detect that the conversation has ended if a carrier is still present.

Therefore, there is a need in the art to provide a simplified method and apparatus for decoding the OSW and the subaudible handshake signal transmitted by a dispatch trunked radio system, while not unduly compromising the effectiveness of the signaling technique, thus making it possible for a radio receiver system capable of tracking a dispatch trunked radio system to be inexpensively manufactured.

SUMMARY OF THE INVENTION

According to one aspect of the invention, a decoder and decoding method for receiving and processing a data bit stream to recover information impressed thereon are provided. The data bit stream includes information bits interleaved with error checking bits. The decoder comprises bit de-interleave means for receiving the data bit stream and producing a de-interleaved bit stream corresponding to a subset of the bit stream, decoder storage means for storing a predetermined sequence of autosynchronization bits, the predetermined sequence of autosynchronization bits corresponding to a subset of the autosynchronization bits which are impressed on the data bit stream, decoder combining means for combining the de-interleaved bit stream with the predetermined sequence of autosynchronization bits to provide recovered information bits, error detector storage means for storing a predetermined subset of the possible messages capable of being encoded in the data bit stream, and error detector means for indicating the presence of errors in the recovered information bits, the error detector means further indicating the presence of one of the predetermined subset of the possible messages capable of being decoded in the data bit stream.

According to another aspect of the invention, a decoder and decoding method for detecting the presence of a subaudible handshake signal on an assigned voice channel are provided. The decoder is used in a system for receiving transmissions of a dispatch trunked radio system employing both a control channel to transmit information in the form of outbound signal words and a subaudible handshake signal transmitted on the assigned voice channel. The decoder comprises comparator means for converting a continuous analog waveform applied to the comparator means to a binary valued digital signal, sampling means for producing a plurality of sample values of the digital signal, the sampling means generating the sample values at a predetermined rate, pattern matching means for finding instances of sequences of like valued binary bits of predetermined length in the plurality of sample values, the pattern matching means producing a count of the number of instances of like valued binary bits, and discriminator means for indicating that the subaudible handshake signal is present on the assigned voice channel when the count exceeds a predetermined relationship.

According to a further aspect of the invention, a system for receiving and following the transmissions of a trunked dispatch system is provided. Such a system may be implemented in a scanner type radio. The system comprises a receiver having a receive frequency that is controllable among a control channel and a plurality of voice channels, a first decoder for decoding a data bit stream on the control channel and detecting the presence of one of a predetermined subset of the possible messages capable of being encoded in the data bit stream, the data bit stream containing a voice channel message indicative of a voice channel of the plurality of voice channels for operation of the receiver, means responsive to the voice channel message for operating the receiver on the voice channel indicated by the voice channel message, a second decoder for detecting a subaudible handshake signal on the voice channel, the subaudible handshake signal containing a tone burst indicative of a command to return to the control channel, and means responsive to the tone burst for operating the receiver on the control channel.

BRIEF DESCRIPTION OF THE DRAWINGS

For a better understanding of the present invention, reference is made to the accompanying drawings, which are incorporated herein by reference and in which:

FIG. 2 is an illustration of a typical format for transmission of coded information frames over the control channel of a dispatch trunked radio system;

FIG. 3 is a block diagram of a prior art digital encoder for generating coded information frames shown in FIG. 2;

FIG. 4 is a block diagram of a prior art digital decoder for decoding information frames generated by the digital encoder of FIG. 3;

FIG. 5 is an illustration of a 27 bit information frame to be coded for transmission;

FIG. 6 illustrates the generation of the coded information frame by the digital encoder of FIG. 3;

FIG. 8A illustrates the decoding of the coded information frame by the decoder of FIG. 7A;

FIG. 8B illustrates the decoding of the coded information frame by the decoder of FIG. 7B;

DETAILED DESCRIPTION

Figure 1:
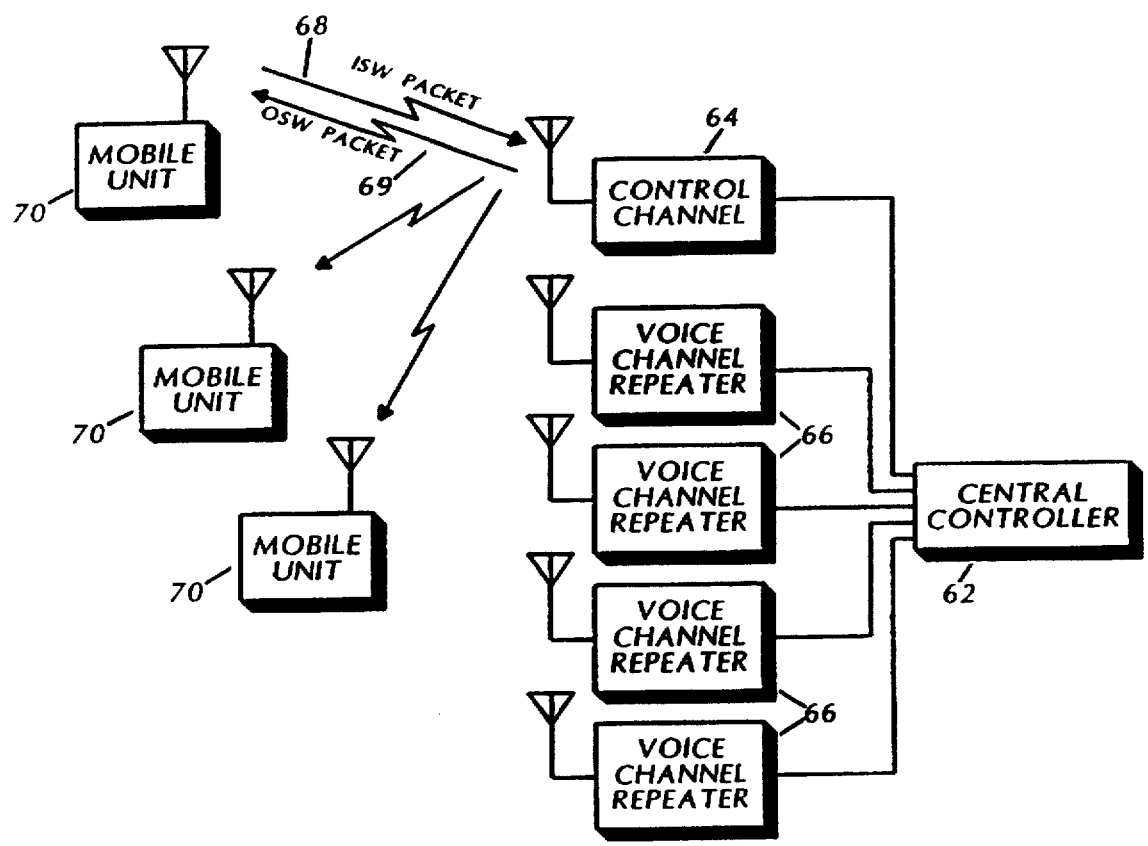
FIG. 1 is a block diagram of a dispatch trunked radio system compatible with the present invention.
Figure 10:
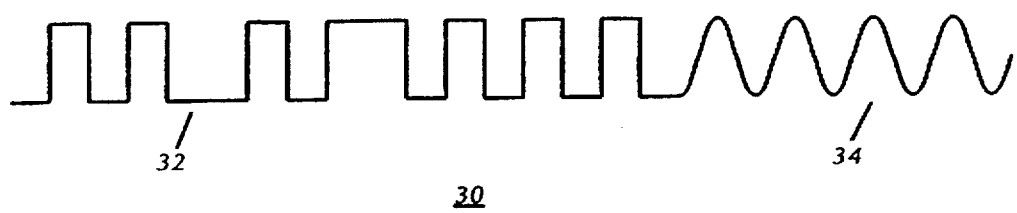
FIG. 10 is an illustration of the subaudible handshake signal present in the low frequency range of a received voice signal of a dispatch trunked radio system compatible with the present invention.

FIG. 1 illustrates a dispatch trunked radio system 60 of a type compatible with the present invention. A central controller 62 allocates a plurality of trunked repeaters 66, one of which is selected to serve as the control channel 64, and a plurality of mobile units 70. Call requests 68, called ISWs (Inbound Signalling Words), encoded by the mobile units are relayed by the control channel 64 to the central controller 62. The central controller 62 allocates the limited channel resources 66 (four are shown) among the several mobile units 70 (three are shown) by assembling data packets 110, as shown in FIG. 5, then encoding and transmitting them as coded information frames 19, as shown in FIG. 2, preceded by a "sync" pattern 18. The mobile units 70 decode the coded information frames 19, called OSW (Outbound Signal Words) 69, which cause the mobile units 70 to move to an assigned voice channel 66, where the mobile units 70 begin to decode a subaudible handshake signal 30, as shown in FIG. 10. When a transmitting mobile unit 70 ceases transmitting, the central controller 62 causes a predetermined tone burst 34, as shown in FIG. 10, to replace the digital data 32 in the subaudible handshake 30, which is continuously present on the assigned voice channel 66. The mobile units 70 engaged in the conversation on the assigned voice channel 66 detect the subaudible tone burst 34 and return to the control channel 64.

FIG. 2 illustrates a digital transmission format for transmitting the OSW information over the control channel of a dispatch trunked radio system. A signal 14 is plotted in graphical form as a function of time. A receiver tuned to the control channel 64 (FIG. 1) searches the received signal until it finds and identifies the "sync" pattern 18. The "sync" pattern is a short preamble, used by the receiver to determine the point in time when the binary bits of the coded information frame 19 begin. The coded information frame 19 is of predetermined length.

Because received information in any real-world communications system is corrupted by noise, and may therefore contain errors, coding is employed. Coding is a technique that adds certain bits to the data prior to transmission so that many errors may be detected and corrected at the receiver. The coding process at the transmitter necessarily causes a substantial number of bits to be added to the original data, thus increasing the amount of data to be transmitted.

Referring now to FIG. 3, a prior art encoder 20 of the type used with the dispatch trunked radio systems compatible with the present invention is shown. The encoder has an input 22 which receives a group of data bits 100, as shown in FIG. 5, comprising an information frame to be coded for transmission. A cyclic block coder 24 receives the data bits and generates a cyclic block code by adding additional bits which are functionally related to the data bits. Parameters K, the number of input bits, and N, the number of output bits, are conventional block code notations and are sometimes written as (N, K) to describe the particular code used. The block code is combined by a combiner 28 with an N bit auto-sync frame, which is a predetermined sequence stored in a storage device 26. The output of combiner 28, an N bit sequence referred to as a concatenated code, is received by a convolutional encoder 30. The convolutional encoder adds N plus 2 bits, for a total of 2(N+1) bits which are supplied to a bit interleave circuit 32 and scrambled for transmission on an encoder output line 34.

Referring now to FIG. 6, the encoder 20 operations are summarized. First, a packet 82 of 27 data bits is assembled by the central controller. These data bits represent mobile unit addresses, voice channel designations, and certain other special functions.

Next, the data bits are passed to cyclic block encoder 24, which appends 10 additional bits, designated as $D_{27}$ through $D_{36}$. These additional bits are intended for error correction in the data recovery process. A (37, 27) block code 84 is generated by foreshortening a cyclic (45, 35) block code.

Then, an auto sync sequence 86 is recalled from storage. This sequence is $198703565B (hexadecimal), which exhibits very low correlations to its cyclic rotations.

Next, the auto sync sequence 86 is added to the block code 84 by modulo-2 (exclusive OR) addition of the corresponding individual bits in combiner 28 to provide a concatenated code 88.

Next, the concatenated code 88, bits $I_0$ through $I_{36}$, are passed through the rate one-half convolutional encoder 30 which generates a convolutional code 90 including 38 parity bits, designated $P_0$ through $P_{37}$. The rate one-half convolutional encoder 30 also generates a dummy zero flush-out bit just before the last parity bit $P_{37}$.

Next a coded information frame 92 is derived by interleaving the bits of the rate one-half convolutional code 90 in bit interleave circuit 32. As a result of this operation, the even numbered concatenated code bits $I_0$ through $I_{36}$ are transmitted first, followed by the even numbered parity bits $P_0$ through $P_{36}$, followed by the odd numbered concatenated code bits $I_1$ through $I_{35}$ and the flush-out bit, and lastly the odd numbered parity bits $P_1$, through $P_{37}$.

Finally, the asynchronous transmission format 94 for the data comprising the OSW is completed by appending an 8-bit sync preamble to the coded information frame.

Referring now to FIG. 4, the prior art decoder 40 of the type used with the dispatch trunked radio systems compatible with the present invention is shown. The operation of this decoder is generally the inverse of the encoder 20.

The 8-bit sync preamble is stripped from the 84 bit transmission format 94. A de-interleave circuit 44 has an input 42 which receives the remaining data bits. The resultant de-interleaved data is received by a convolutional decoder 46, which operates in an inverse manner to the encoder 30 and corrects some burst type errors that may have occurred during transmission. An auto sync frame is stored in a storage device 48. The output of the decoder 46 is modulo-2 added to an auto sync frame by a combiner 50, effectively stripping from the data the auto sync frame impressed on it by the encoder 20. The auto sync frame 48 corresponds to the auto sync frame in storage device 26 of the encoder. The output of combiner 50 is passed to a cyclic block decoder 52, which recalculates the extra bits at the receiver and compares these bits with the extra bits that were received. If the recalculated bits do not match the received bits, then an error is indicated at output 54. Decoded data, the same as the original 27 data bits, $D_0$ through $D_{26}$, comprising the data packet 100 in FIG. 5, is present at output 56 of the decoder.

Figure 7A:
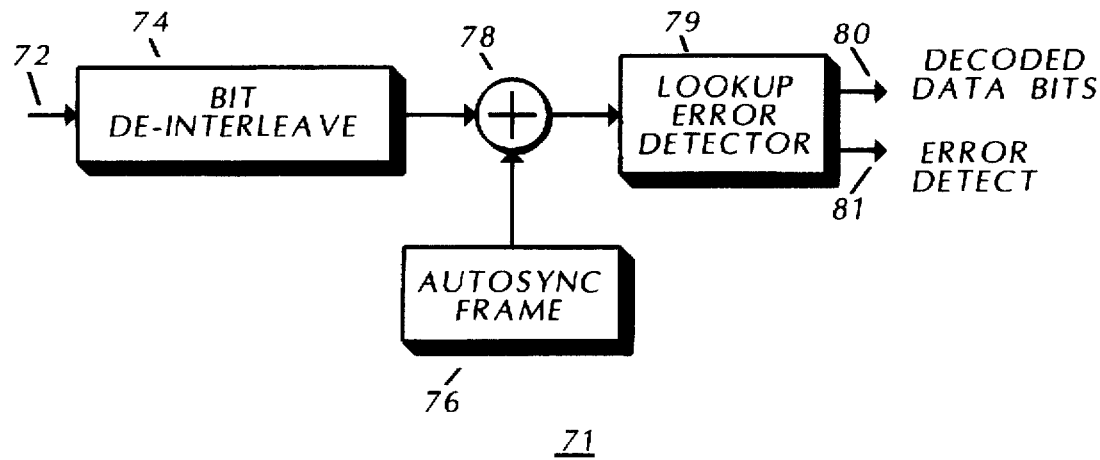
FIG. 7A is a block diagram of a decoder in accordance with a first embodiment of the present invention.

Referring now to FIG. 7A, a block diagram of a first embodiment of the simplified OSW decoder 71 of the present invention is shown. The decoder 71 has an input 72 which receives the coded information frame 19 shown in FIG. 2. The coded information frame is input to a de-interleave circuit 74. Only a subset of the received data is de-interleaved by the de-interleave 74, the remainder being discarded. The output data is combined by a combiner 78 with a truncated autosynchronization frame, which is a predetermined sequence stored in a storage device 76. The combiner 78 performs a modulo-2 addition (exclusive-OR) on data present at its inputs. The result of combiner 78 is a K bit sequence that represents the original 27 data bits, $D_0$ through $D_{26}$. An error detector 79 ensures that the data bits $D_{17}$ through $D_{26}$ represent a voice channel designation on which the dispatch trunked radio system is authorized to operate. If not, an error condition is indicated at output 81. If the data bits have been received without error, then the decoded data is recovered at a data output 80, representing the OSW.

Referring now to FIG. 8A, the decoder 71 operations are summarized. In the preferred embodiment of the present invention, a microprocessor implementation of the simplified decoding method is the most practical implementation.

First, a predetermined number of bits of received data 90 is stored in a storage device. Typically, the number of bits stored will amount to several hundred milliseconds of received data comprising several hundred bits. Present in these several hundred bits may be one or more 8-bit sync preambles 92. Employing methods well known in the art, the stored data is searched for the occurrence of a preamble 92. Upon finding a preamble, the next 76 bits immediately following the preamble are designated as the elements of a one dimensional array BITREG of length 76.

Next, a bit de-interleave operation is performed. Bits $I_0$ through $I_{26}$ 94 of received data 90 are copied so that a one dimensional array designated OUTREG of length 27 is formed. The elements of OUTREG are formed from BITREG so that OUTREG(2i)=BITREG(i) for i=0 through 13 and OUTREG(2i+1)=BITREG(i+38) for i=0 through 12. Thus the array OUTREG is made to contain in ascending (de-interleaved) order the first 27 elements $I_0$ through $I_{26}$ of the concatenated code 88 shown in FIG. 6 to form de-interleaved data 102. The remaining ten elements $I_{27}$ through $I_{36}$ of the concatenated code 88 and the 38 parity bits $P_0$ through $P_{37}$ 96 of received data 90 are not required by the method of the present invention.

Next, an auto sync sequence 104 is recalled from storage, which in the case of a microprocessor implementation is memory. The sequence is $661C0D5 (hexadecimal), which is a truncated version of auto sync sequence 86 shown in FIG. 6. The shortened auto sync sequence 104 consists of only the first 27 bits of the auto sync sequence 86. Since the ten elements $I_{27}$ through $I_{36}$ of the concatenated code 88 are not used, there is no point in stripping the auto sync sequence, impressed at the transmitter, from them.

Finally, the auto sync sequence 104 is added to the OUTREG array (de-interleaved data 102) by modulo-2 (exclusive-OR) addition of the corresponding individual bits, causing the auto sync sequence impressed upon the data at the transmitter to be removed. In a microprocessor, the bit-by-bit modulo-2 addition may be performed one byte at a time. The resultant elements of the OUTREG array (recovered data bits 106) are now the same as the original data bits $D_0$ through $D_{26}$ comprising the data packet 110 shown in FIG. 5.

Referring to FIG. 5, it is seen that a data packet 110 contains a ten bit message field 116. This message field may contain information that represents a channel assignment, or other formatting or control information relating to numerous functions supported by the dispatch trunked radio system. The majority of these functions bear no relevance to the implementations to which this invention is directed, some of them being concerned with dispatch trunked radio system status notification, telecom interconnect, talk-group reassignment, paging, and others. Additionally, there are a number of dispatch trunked radio system variants in operation, which are compatible with the present invention. Some require that mobile units decode two successive OSWs to obtain a voice channel assignment, some require only one OSW to be decoded, and others may, at the option of the central controller, require the decoding of either one OSW or two adjacent OSWs.

Figure 9:
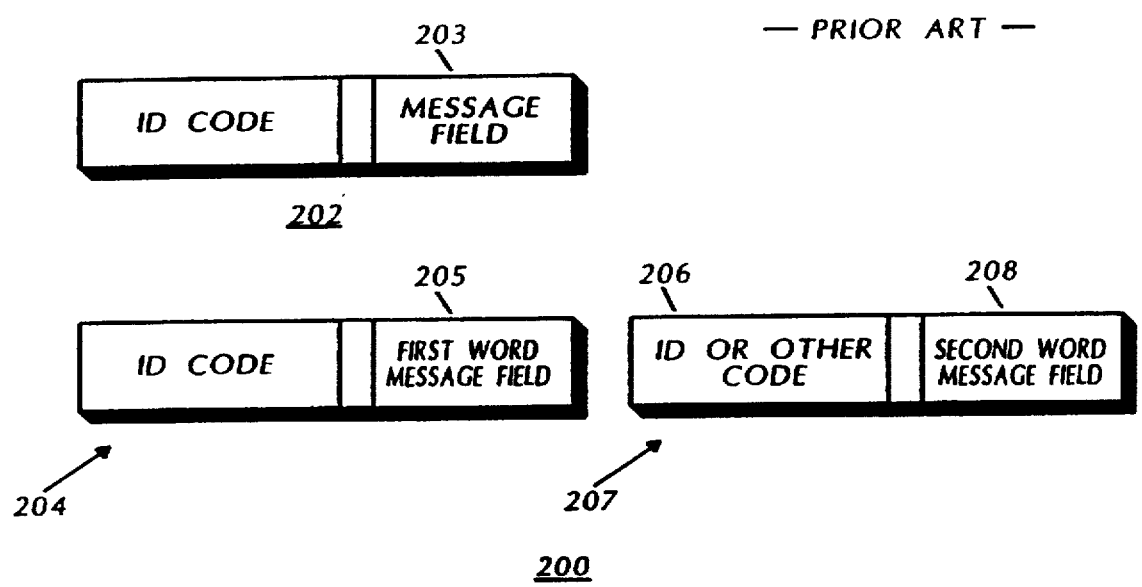
FIG. 9 is an illustration of single word and dual word formats produced by a dispatch trunked radio system compatible with the present invention.

Referring now to FIG. 9, the format of each of the aforementioned OSW variants is shown. The single word data packet 202 is decoded by the mobile unit without reference to any other OSWs transmitted on the control channel. A single word message field 203 always represents a voice channel assignment or system status. The dual word variant contains a first word data packet 204 and a second word data packet 207, each of which is encoded into an OSW. A first word message field 205 contains a predetermined binary value indicating that it is the first word of the dual word OSW format and that the immediately following OSW is the second word. A first field 206 of the second word data packet 207 contains information relating to the type of call the participating units will engage in. A second word message field 208 contains a voice channel assignment or system status, such as a "system busy code." The dual word optional variant contains first word data packet 204 and an optional second word data packet 207. If the central controller desires to format and transmit a single word OSW, then the first word message field 205 has the same meaning and interpretation as the single word message field 203 contained in data packet 202. If, however, it is desired to format and transmit a dual word OSW, then the message field 205 of first word data packet 204 contains a predetermined binary value indicating that it is the first word of a dual word OSW and that the immediately following OSW is the second word. The message field 208 of the second word then contains a voice channel assignment.

The present invention relates to methods and apparatus for simplified decoding for use in a radio receiver system capable of tracking a dispatch trunked radio system. Therefore, with one exception, only voice channel assignment messages are useful in the operation of the radio. The exception is that the dual word variants may sometimes encode dual word OSWs for the purpose of assigning a voice channel for private communications between two subscribers. In such a case, the first word message field of a dual word OSW, contains a predetermined binary value indicating the private call function. The subsequent OSW message field then contains a voice channel assignment. In view of the foregoing, it can be seen that a radio receiver system employing the present invention need only decode OSWs which contain a voice channel assignment or the predetermined binary value of a first word OSW message field indicating a private type call. Accordingly, any decoded OSW which does not contain either the predetermined binary value of a first word OSW, or a value indicating a channel assigned to the dispatch trunked radio system, is either not useful or the result of an error. Therefore, it is only necessary to verify that the message field part of any OSW contains either the predetermined binary value of a first word OSW, or one of the plurality of channels assigned to the dispatch trunked radio system.

In summary, the error detection function of the first embodiment of the OSW decoder is accomplished as follows; the elements of the OUTREG array OUTREG(17) through OUTREG(26), representing data bits $D_{17}$ through $D_{26}$ and encoding a binary value comprising the message field 116 in data packet 110 shown in FIG. 5, is compared to a plurality of binary values stored in a storage device, which is memory in the case of a microprocessor implementation. The stored binary values are all the channels assigned to the dispatch trunked radio system and the predetermined binary value used to designate a first word OSW. If the value encoded by the elements of the OUTREG array OUTREG (17) through OUTREG(26) is equal to any one of the aforementioned stored binary values, then the OSW is treated as valid; otherwise it is treated as an error. As there are only a small number of channels (generally less than 25) assigned to each dispatch trunked radio system and the message field 116 may encode $2^{10}$ possible binary values, an error has a small probability of going undetected. It may also be noted that the step of error detection simultaneously determines if the OSW is a member of the subset of OSWs of interest to a radio receiver system capable of tracking a dispatch trunked radio system.

Figure 7B:
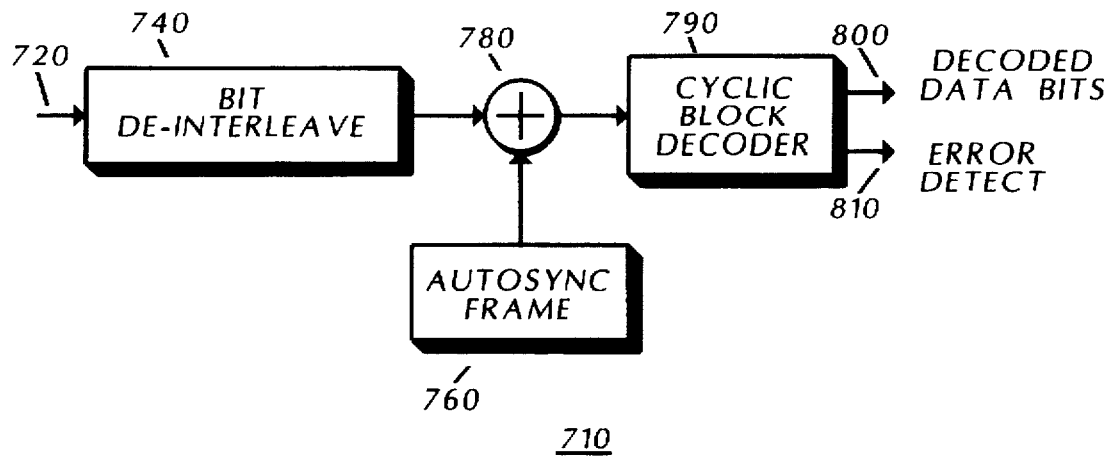
FIG. 7B is a block diagram of a decoder in accordance with a second embodiment of the present invention.

A block diagram of the second embodiment of the simplified OSW decoder and error detector of the present invention is shown in FIG. 7B. A decoder 710 has an input 720 which receives the coded information frame 19 in FIG. 2. The received data is de-interleaved by de-interleaver 740. The resultant data is combined by a combiner 780 with an autosynchronization frame, which is the predetermined sequence 86 of FIG. 6 stored in a storage device 760. The combiner 780 performs a modulo-2 addition (exclusive-OR) on data present at its inputs. The result of combiner 780 is a sequence that represents the original 27 data bits, $D_0$ through $D_{26}$, as well as the additional 10 error detection bits, $D_{27}$ through $D_{36}$, generated by the (37, 27) block encoder. The output of combiner 780 is received by a (37, 27) block decoder 790 where the error detection bits, $D_{27}$ through $D_{36}$, are recalculated from the data bits, $D_0$ through $D_{26}$, for the purpose of error detection.

Referring now to FIG. 8B, the operations of decoder 710 are summarized. In the preferred embodiment of the present invention, a microprocessor implementation of the simplified decoding method is the most practical implementation.

First, a predetermined number of received data bits 900 is stored in a storage device. Typically, the number of bits stored will amount to several hundred milliseconds of received data comprising several hundred bits. Present in these several hundred bits may be one or more 8-bit sync preambles 920. Employing methods well known in the art, the stored data is searched for the occurrence of a preamble. Upon finding a preamble, the next 76 bits immediately following the preamble are designated the elements of a one dimensional array BITREG of length 76.

Next, a bit de-interleave operation is performed, the result being de-interleaved data 1020. Bits $I_0$ through $I_{36}$, 940 in FIG. 8B are copied so that a one-dimensional array designated OUTREG of length 37 is formed. The elements of OUTREG are formed from BITREG so that OUTREG(2i) =BITREG(i) for i=0 through 18 and OUTREG(2i+1)= BITREG(i+38) for i=0 through 17. Thus, the array OUTREG is made to contain, in ascending (de-interleaved) order, the 37 elements $I_0$ through $I_{36}$ of the concatenated code 88 in FIG. 6.

Next, an auto sync sequence 1040 in FIG. 8A is recalled from storage, which in the case of a microprocessor implementation is memory. The sequence $198703565B is the predetermined sequence 86 of FIG. 6 stored in a storage device.

Finally, the auto sync sequence 1040 is added to the OUTREG array by modulo-2 (exclusive-OR) addition of the corresponding individual bits, causing the auto sync sequence impressed upon the data at the transmitter to be removed. In a microprocessor, the bit-by-bit modulo-2 addition may be performed a byte at a time. The resultant elements of the OUTREG array are now the same as the original data bits $D_0$ through $D_{26}$ comprising the data packet 110 in FIG. 5 with the additional ten error detection bits $D_{27}$ through $D_{36}$ appended. The resultant array, recovered block code 1060, is therefore the same as block code 84 in FIG. 6.

The received data bits $D_0$ through $D_{26}$ are presented to the block decoder 790, which recalculates the received error detection bits $D_{27}$ through $D_{36}$. The method of recalculating error detection bits from data bits is well known in the art. If the locally recalculated error detection bits match the received error detection bits, then the recovered data 1080 has been received without error and is made available at data output 800. Otherwise, an error has occurred and is so indicated at error detect output 810. As in the first embodiment of the simplified OSW decoder and error detector, any decoded OSW which does not contain either the predetermined binary value of a first word OSW, or a value indicating a channel assigned to the dispatch trunked radio system, is not useful. Therefore, although the error detection function is performed by the block decoder 790, it is still necessary to verify that the message field part of any OSW contains either the predetermined binary value of a first word OSW, or encodes any one of the plurality of channels reserved for dispatch trunked radio system users. This embodiment of the simplified OSW decoder and error detector has the principal advantage that the user does not need to know which voice channels have been assigned for use by a particular trunked dispatch system.

Figure 11:
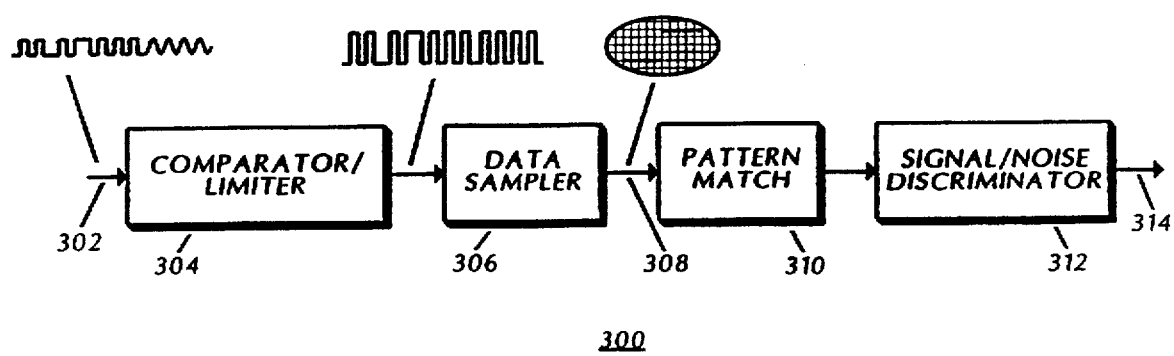
FIG. 11 is a block diagram of the subaudible handshake detection apparatus of the present invention.

FIG. 10 illustrates the subaudible handshake signal format used for sending information to a mobile unit of a dispatch trunked radio system compatible with the present invention, while the mobile unit is operating on the voice channel and is engaged in a conversation. The signal 30, if present at input 302 in FIG. 11, is a low speed data signal that occupies the frequency spectrum between the lower edge of the voice frequency spectrum and 0 Hz. While the mobile unit is engaged in a conversation on an assigned voice channel, the subaudible handshake signal is continuously present. When a user is finished talking and releases the push-to-talk button, the central controller 62 commands all participating mobile units to return to the control channel 64 by transmitting the tone burst 34 of predetermined frequency and duration, which replaces the low speed digital data 32 present on the voice channel. When the tone burst 34 ceases, either noise or an unmodulated carrier is present at input 302. The mobile unit detects this tone burst, which causes the mobile unit to return to the control channel.

FIG. 10 shows the general form of the low speed digital data 32 transmitted on the voice channel during a conversation. The digital data 32 is decoded by the mobile units and serves to identify the talk group affiliation of the communicating mobile units. When the central controller determines that the mobile units have finished using the assigned voice channel, it removes the digital data 32 and replaces it with the short tone burst 34, which is detected by the mobile units and causes them to return to the control channel.

The method of the present invention contemplates performing the subaudible handshake detection function as follows. By techniques well known in the art, the waveform present at input 302 in FIG. 11 is conditioned, being passed through a comparator/limiter 304, then sampled by a data sampler 306 at a predetermined rate sufficient that a plurality of binary valued samples of predetermined minimum number will be obtained during each bit period of the signal 30 if it is present at input 302. Additionally, the predetermined sampling rate must be sufficient to produce sample values of low auto-correlation if only noise is present at input 302. The sampling operation occurs for a predetermined length of time, typically on the order of 100 milliseconds. Samples present at output 308 of data sampler 306 are stored in a storage device, which is a memory in the case of a microprocessor implementation.

The stored, binary valued samples, having values of either 1 or 0, are designated the elements of a one dimensional array SUBDATA of predetermined length N. The array is searched, by any of a number of pattern matching methods known in the art, by a pattern matcher 310 for runs of successive, like valued, binary bits of predetermined run length k. For each instance of the index variable i, where i=0 through N-k, if the k elements of array SUBDATA(i) through SUBDATA(i+k) are each equal to 1, then a counter variable, C1, is incremented. Similarly, for each instance of the index variable i, where i=0 through N-k, if the k elements of array SUBDATA(i) through SUBDATA(i+k) are each equal to 0, then a counter variable, C0, is incremented.

If the signal 30 and no carrier are present on the assigned voice channel, as for instance when the central controller has finished transmitting the tone burst 34, then due to the random nature of noise present on the channel, a distribution of sample values at output 308 with few instances of long sequences of like valued binary bits will occur.

If the signal 30 is present on the assigned voice channel, then due to the sample rate of the data sampler 306 greatly exceeding the bit rate of the signal 30, the output 308 will include a plurality of instances of long sequences of like valued binary bits.

If a carrier is present, but without the impressed signal 30, a receiver may produce a continuous DC value, which after passing through the comparator/limiter 304, causes sample values of predominantly ones or predominantly zeroes to be present at output 308. A signal/noise discriminator 312 following the pattern matcher 310 implements the following:

If the sum of C1 and C0 does not exceed a predetermined value S, then no carrier and no signal is present on the assigned voice channel.

If the sum of C1 and C0 exceeds the predetermined value S, then either the signal 30, or a carrier and no signal, is present.

If the difference between C1 and C0 exceeds a predetermined value D, then a carrier and no signal is present on the assigned voice channel.

If the difference between C1 and C0 does not exceed the predetermined value D and the sum of C1 and C0 exceeds the predetermined value S, then the signal 30 is present on the assigned voice channel.

Accordingly, signal/noise discriminator 312 implements the following:

IF (C1+C0)>S
AND
IF ABSOLUTE(C1−C0)<D
THEN
The signal 30 is present on the assigned voice channel and is indicated at output 314 of signal/noise discriminator 312.
ELSE
The signal 30 is not present on the assigned voice channel and is indicated at output 314.

An alternative implementation of the subaudible handshake detection function may be realized if the dispatch trunked radio system immediately removes the carrier after transmitting the tone burst signal 34, as is the case with most systems compatible with the present invention. In this case, the signal/noise discriminator 312 implements the following:

If the sum of C1 and C0 does not exceed a predetermined value S, then no signal 30 is present on the assigned voice channel.

If the sum of C1 and C0 exceeds the predetermined value S, then the signal 30 is present.

Accordingly, signal/noise discriminator 312 may implement the following:

IF (C1+C0)>S
THEN
The signal 30 is present on the assigned voice channel and is indicated at output 314.
ELSE
The signal 30 is not present on the assigned voice channel and is indicated at output 314.

The implementation of the foregoing requires that the determination of the presence of the signal 30 on the assigned voice channel be updated on a continuing basis. Accordingly, if the signal 30 is still present on the voice channel, the variables C0, and C1 are reset to 0 and the appropriate one of the two aforementioned processes is repeated until the signal 30 is no longer present, at which time the receiver is directed to return to the control channel.

Figure 12A:
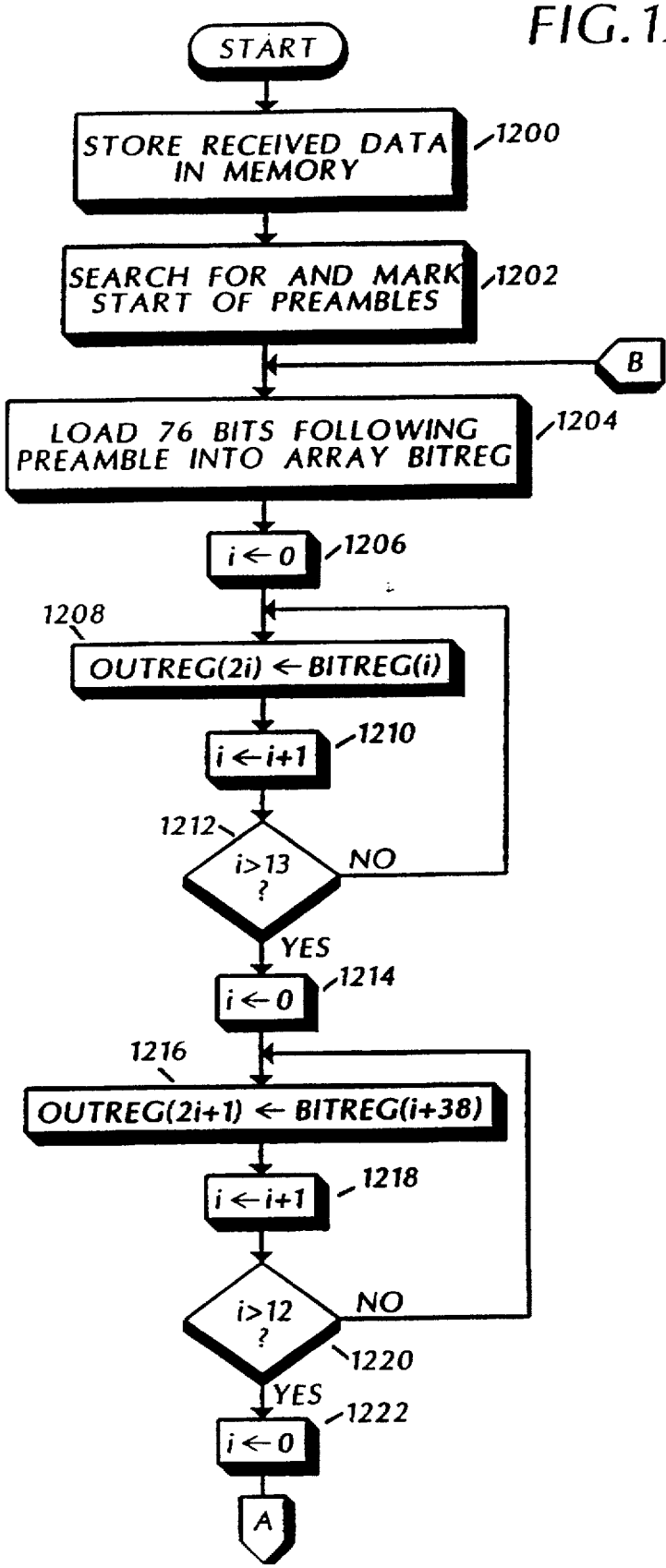
FIGS. 12A and 12B show a flow chart of a process which may be utilized by a microprocessor for decoding of the coded information frame in accordance with the first embodiment of the present invention.
Figure 12B:
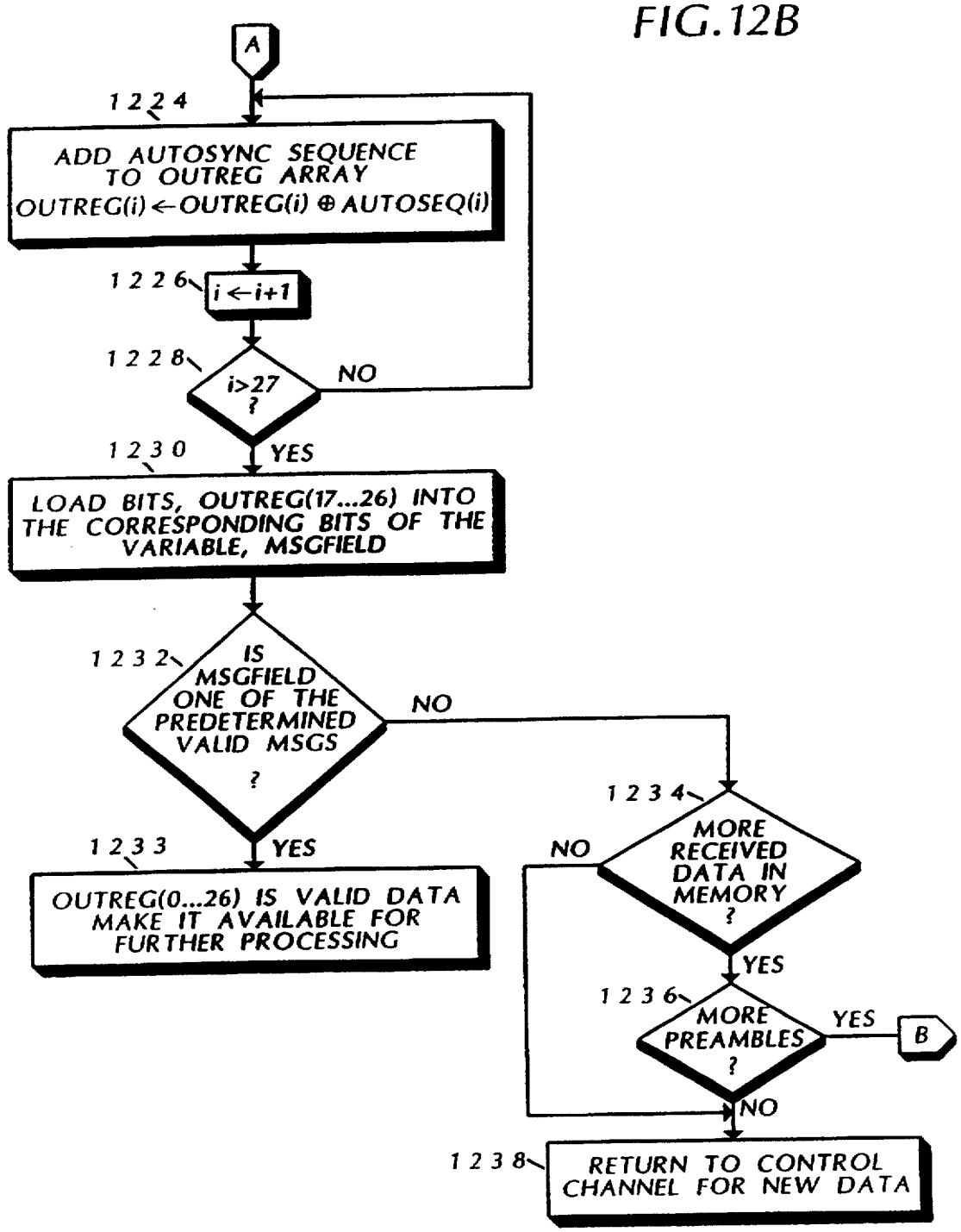
Figure 13A:
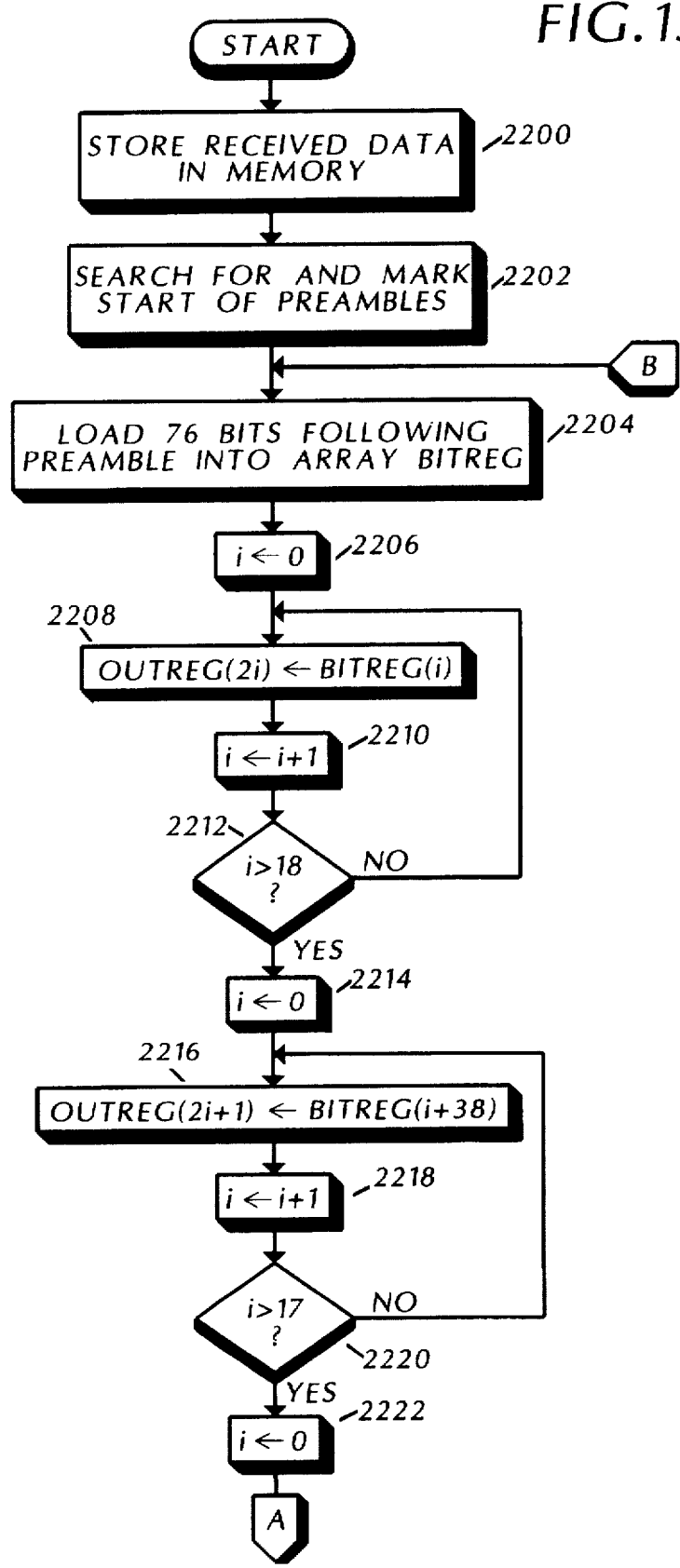
FIGS. 13A and 13B show a flow chart of a process which may be utilized by a microprocessor decoding of the coded information frame in accordance with the second embodiment of the present invention.
Figure 13B:
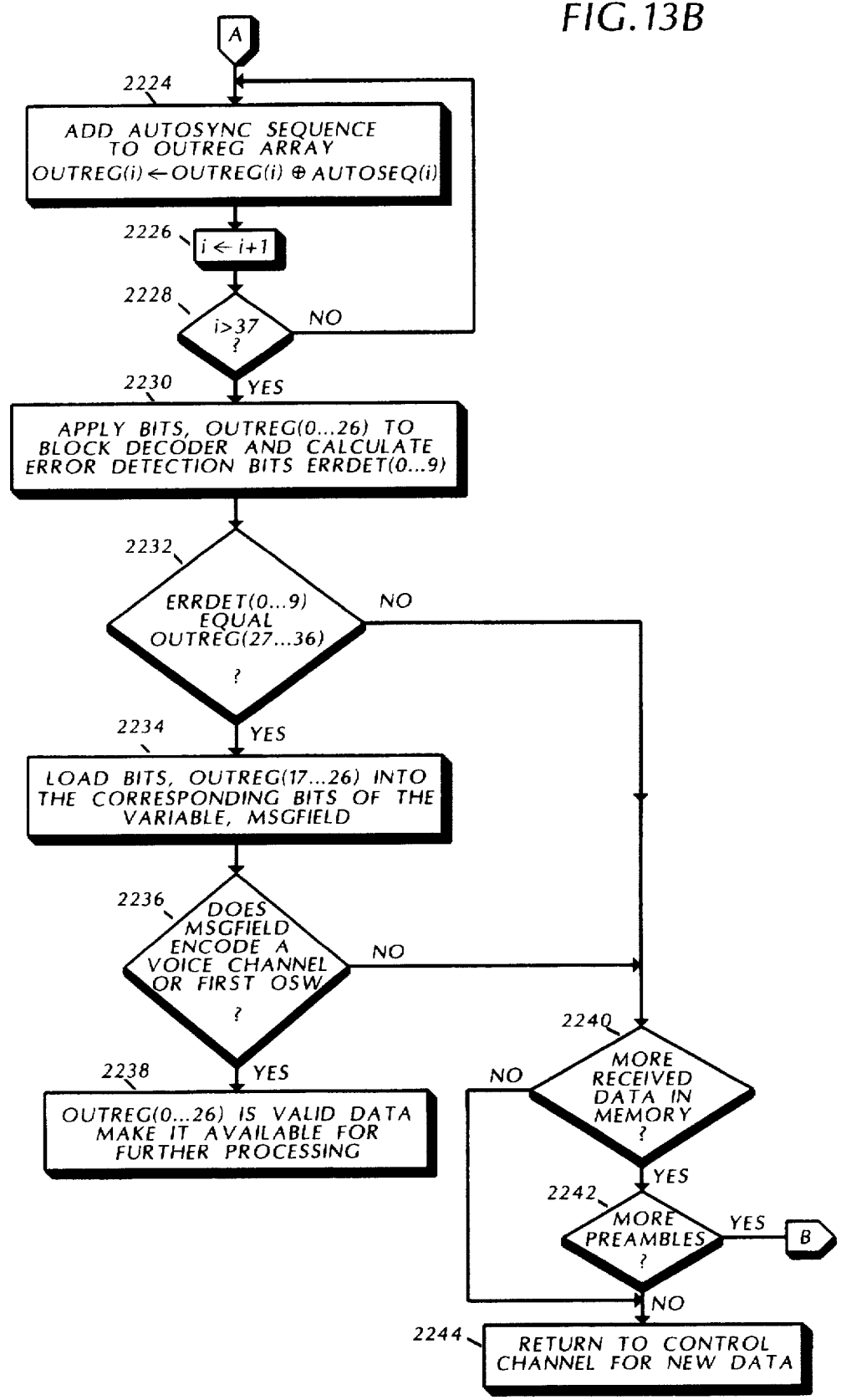

As an illustration of how the simplified decoding methods can be implemented, the decoding steps, as they may be implemented in software of a typical radio receiver system for reception of a dispatch trunked radio system, are now described with reference to FIGS. 12A, 12B, 13A, 13B and 14. FIGS. 12A and 12B collectively illustrate the steps for decoding the OSW as described above in connection with FIGS. 7A and 8A. FIGS. 13A and 13B collectively illustrate the steps for decoding the OSW as described above in connection with FIGS. 7B and 8B.

Referring now to step 1200 in FIG. 12A, a predetermined number of bits of serial data received from the discriminator output of a radio tuned to the control channel 64 shown in FIG. 1 is stored in memory. In step 1202, the 8 bit sync preambles shown in FIG. 2 are searched for and indexed. In step 1204, the 76 bits immediately following an 8 bit preamble are loaded into an array of bits, BITREG. Steps 1206 through 1220 illustrate the de-interleave function. In step 1206, an index variable, i, is initialized to 0. In step 1208, an element of the array OUTREG, OUTREG(2i), is set equal to the value of BITREG(i), after which the index variable i is incremented by one in step 1210. In step 1212, index variable i is checked to determine if it is greater than 13. If it is not, then another element is retrieved. If index variable i is greater than 13, then all the even elements constituting OUTREG have been retrieved, and control passes to step 1214, where the index variable i is reset to 0. In step 1216, an element of the array OUTREG, OUTREG (2i+1), is set equal to the value of BITREG(i+38), after which the index variable i is incremented by 1 in step 1218. In step 1220, index variable i is checked to determine if it is greater than 12. If it is not, then another element is retrieved. If index variable i is greater than 12, then all the odd elements constituting OUTREG have been retrieved, and the de-interleave process for the OSW is complete, control passing to step 1222, where the index variable i is reset to 0.

In step 1224, an element of the autosync sequence 104 shown in FIG. 8A, AUTOSEQ (i) is added modulo-2 to OUTREG(i), the result being stored in OUTREG(i). In step 1226, the index variable i is incremented by 1. In step 1228, the value of index variable i is tested and if it is not greater than 27, control is passed to step 1224, where the next element of the autosync sequence 104 AUTOSEQ(i) is added modulo-2 to OUTREG(i). If index variable i is greater than 27, the autosync sequence extraction is complete, and control passes to step 1230, where ten bits of the OUTREG array, OUTREG(17) through OUTREG(26), are loaded into the corresponding bit positions of the variable MSGFIELD, OUTREG(17) becoming the most significant bit of MSG-FIELD and OUTREG(26) becoming the least significant bit. In step 1232, the value of MSGFIELD is compared to each of the predetermined valid messages stored in memory. If one of these predetermined valid messages is equal to MSGFIELD, then control passes to step 1233, where all 27 bits of the OUTREG array are made available for further processing. If none of the predetermined valid messages are equal to MSGFIELD, then the data contained in the OUTREG array is invalid, and control passes to step 1234. In step 1234, it is determined if there is more received data in memory. If not, control passes to step 1238, where the receiver is caused to return to the control channel to acquire more data. If more received data is in memory, then control passes to step 1236, where the existence of more preambles among the received data is determined. If there are no more preambles, then control passes to step 1238, where the receiver is caused to return to the control channel to acquire more data. If more preambles are present, then control passes to step 1204, and the preceding process is repeated.

Referring now to step 2200 of FIG. 13A, a predetermined number of bits of serial data received from the discriminator output of a radio tuned to the control channel 64 in FIG. 1 is stored in memory. In step 2202, the 8 bit sync preambles shown in FIG. 2 are searched for and indexed. In step 2204, the 76 bits immediately following an 8 bit preamble are loaded into an array of bits, BITREG. Steps 2206 through 2220 illustrate the de-interleave function. In step 2206, an index variable, i, is initialized to 0. In step 2208, an element of the array OUTREG, OUTREG(2i), is set equal to the value of BITREG(i), after which the index variable i is incremented by 1 in step 2210. In step 2212, index variable i is checked to determine if it is greater than 18. If not, then another element is retrieved. If index variable i is greater than 18, then all the even elements constituting OUTREG have been retrieved and control passes to step 2214, where the index variable i is reset to 0. In step 2216, an element of the array OUTREG, OUTREG(2i+1), is set equal to the value of BITREG(i+38), after which the index variable i is incremented by 1 in step 2218. In step 2220, index variable i is checked to determine if it is greater than 17. If not, then another element is retrieved. If index variable i is greater than 17, then all the odd elements constituting OUTREG have been retrieved, and the de-interleave process for the OSW is complete, control passing to step 2222 where the index variable i is reset to 0.

Referring now to FIG. 13B, in step 2224, an element of the autosync sequence 1040 shown in FIG. 8B, AUTOSEQ (i), is added modulo-2 to OUTREG(i), the result being stored in OUTREG(i). In step 2226, the index variable i is incremented by 1. In step 2228, the value of index variable i is tested and if it is not greater than 37, control is passed to step 2224, where the next element of the autosync sequence 1040, AUTOSEQ(i), is added modulo-2 to OUTREG(i). If index variable i is greater than 37, the autosync sequence extraction is complete and control passes to step 2230. In step 2230, the cyclic block decoder 790 receives the 27 recovered data bits, $D_0$ through $D_{26}$ of recovered block code 1060, and recalculates the ten error detection bits corresponding to bits $D_{27}$ through $D_{36}$ of recovered block code 1060. In step 2232, the recalculated bits designated ERRDET(0 . . . 9) are compared to the recovered error detection bits, $D_{27}$ through $D_{36}$. If the recalculated bits are equal to the recovered error detection bits, $D_{27}$ through $D_{36}$, then the OSW has been received without error and control is passed to step 2234, where ten bits of the OUTREG array, OUTREG(17) through OUTREG(26), are loaded into the corresponding bit positions of the variable MSGFIELD, OUTREG(17) becoming the most significant bit of MSGFIELD and OUTREG(26) becoming the least significant bit. In step 2236, the value of MSGFIELD is checked to determine if it encodes any of the several hundred predetermined voice channels reserved by the FCC for assignment to trunked dispatch systems, or the first word designator of a dual word OSW. The test performed by step 2236 is determined true if MSGFIELD encodes a number less than the number of reserved predetermined voice channels, thereby encoding a voice channel, or if MSGFIELD encodes the predetermined binary value indicating that it is the first word of a dual word OSW. If the test performed in step 2236 is true, then control passes to step 2238, where the first 27 bits of the OUTREG array are made available for further processing. If either of the tests performed in steps 2232 or 2236 is negative, then either the data contained in the OUTREG array is in error, or else is not useful for the purposes of the present invention, and control passes to step 2240. In step 2240, it is determined if there is more received data in memory. If not, control passes to step 2244, where the receiver is caused to return to the control channel to acquire more data. If more received data is in memory, then control passes to step 2242 where the existence of more preambles among the received data is determined. If there are no more preambles, then control passes to step 2244 where the receiver is caused to return to the control channel to acquire more data. If more preambles are present, then control passes to step 2204, and the preceding process is repeated.

Figure 14:
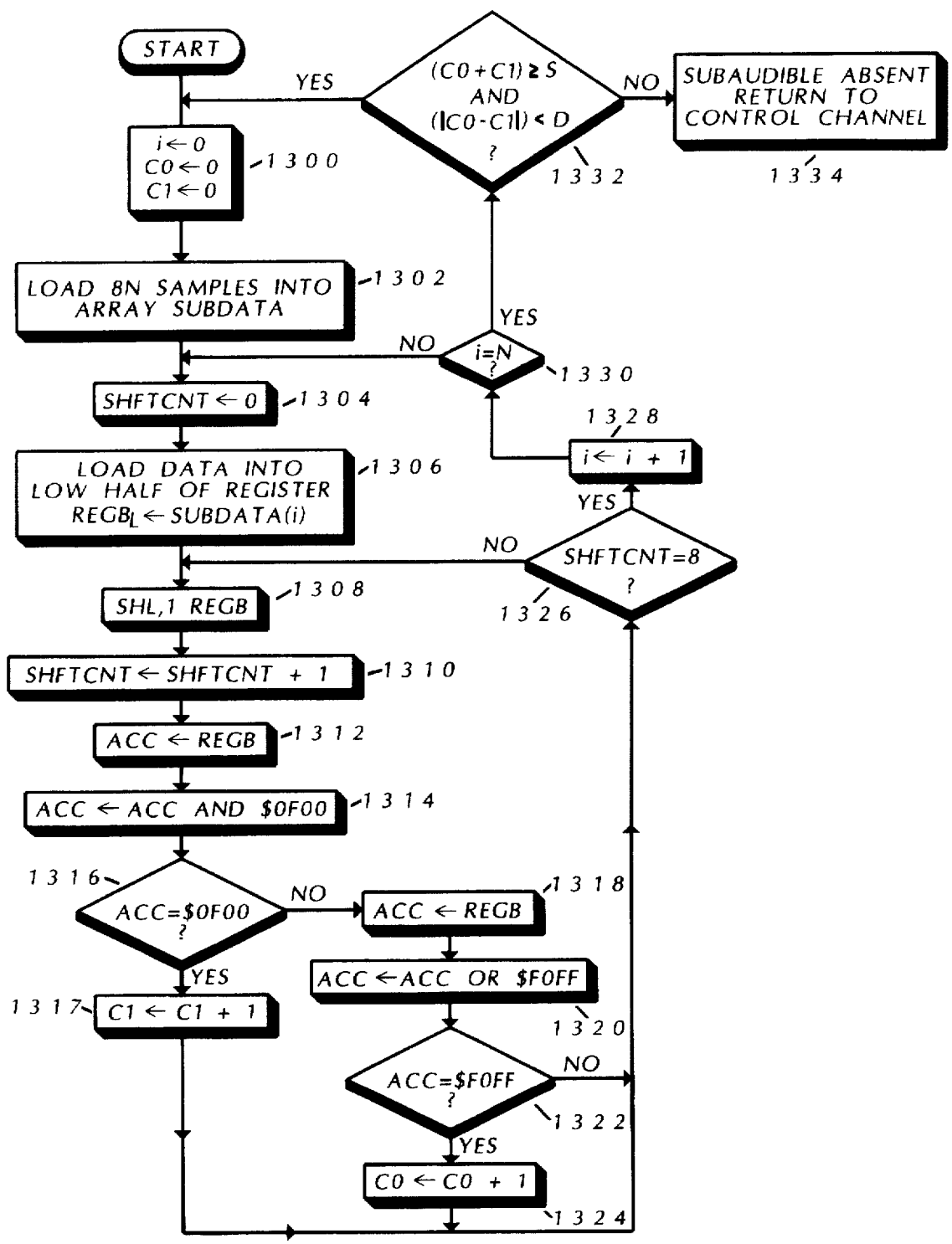
FIG. 14 shows a flow chart of a process which may be utilized by a microprocessor for the detection of the subaudible handshake in accordance with the present invention.

FIG. 14 illustrates the steps for detection of the subaudible handshake. In step 1300, the variables i, C0, and C1 are initialized to 0. In step 1302, an array of 8-bit bytes, SUBDATA, of predetermined length N, is loaded with 8N bits of sample data from data sampler 306 in FIG. 11. In step 1304, a variable, SHFTCNT, is initialized to 0. In step 1306, an element of the array SUBDATA, SUBDATA(i), is loaded into the lower 8 bits of microprocessor register REGB, (REGB$_L$). Register REGB is a 16 bit register. In step 1308, register REGB is shifted one bit to the left. Control passes to step 1310, where variable SHFTCNT is incremented by 1. In step 1312, the contents of register REGB are loaded into the 16 bit accumulator, ACC, of the microprocessor. In step 1314, the operation ACC AND $0F00 is performed, the result being left in accumulator ACC. The value $0F00 is a stored hexadecimal value. In step 1316, the value of ACC is compared with the stored value $0F00. If ACC equals $0F00, then at least four consecutive bits of register REGB are binary ones, and control passes to step 1317, where the variable C1, representing the number of instances of successive runs of ones of predetermined length (in this case length 4), is incremented. If ACC is not equal to $0F00, then four consecutive 1 bits were not detected, and control passes from step 1316 to step 1318. In step 1318, accumulator ACC is reloaded with the contents of register REGB, and control is passed to step 1320, where the operation ACC OR $F0FF is performed, the result being left in accumulator ACC. The value $F0FF is a stored hexadecimal value. In step 1322, if ACC equals $F0FF, then at least four consecutive bits of register REGB are binary zeros, and control passes to step 1324, where the variable C0, representing the number of instances of successive runs of zeros of predetermined length (in this case length 4), is incremented. In step 1326, SHFTCNT is tested to determine if it is equal to 8. If SHFTCNT is not equal to 8, then all the bits in register REGB have not been tested, and control is passed to step 1308 to finish testing them. If SHFTCNT is equal to 8, then all the bits in register REGB have been tested, and control passes to step 1328, which increments the variable i by 1. In step 1330, variable i is compared to N (the SUBDATA array length). If variable i is not equal to N, control passes to step 1304, and a new byte of data is obtained from the SUBDATA array. If variable i is equal to N, then all the data in the SUBDATA array has been processed, and control is passed to step 1332, where two expressions containing C0 and C1 are compared to the predetermined constants S and D. If the relationship in step 1332 is satisfied, then the subaudible handshake signal is present, and control is passed to step 1300, where the process is repeated. If the relationship in step 1332, is not satisfied, then the subaudible handshake signal is not present, indicating that there is no communication occurring on the voice channel, and control is passed to step 1334, where the receiver is directed to return to the control channel.

Figure 15:
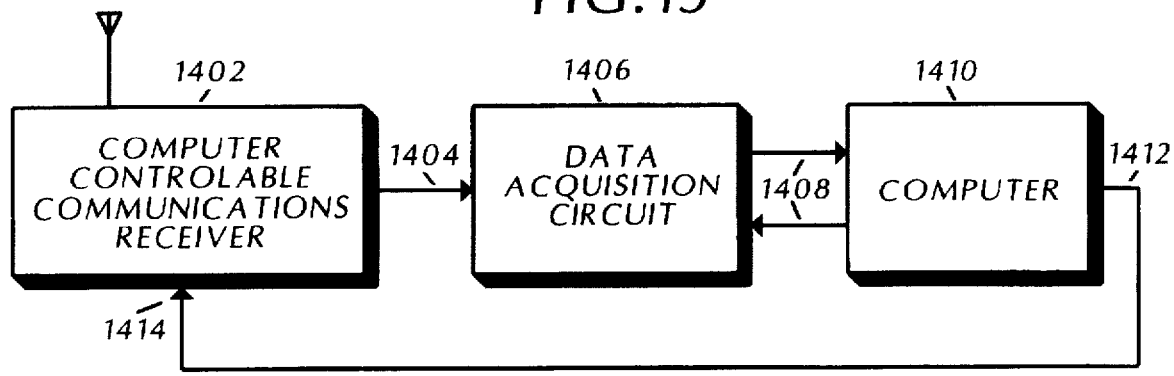
FIGS. 15–17 are block diagrams of hardware configurations which may utilize the present invention.
Figure 16:
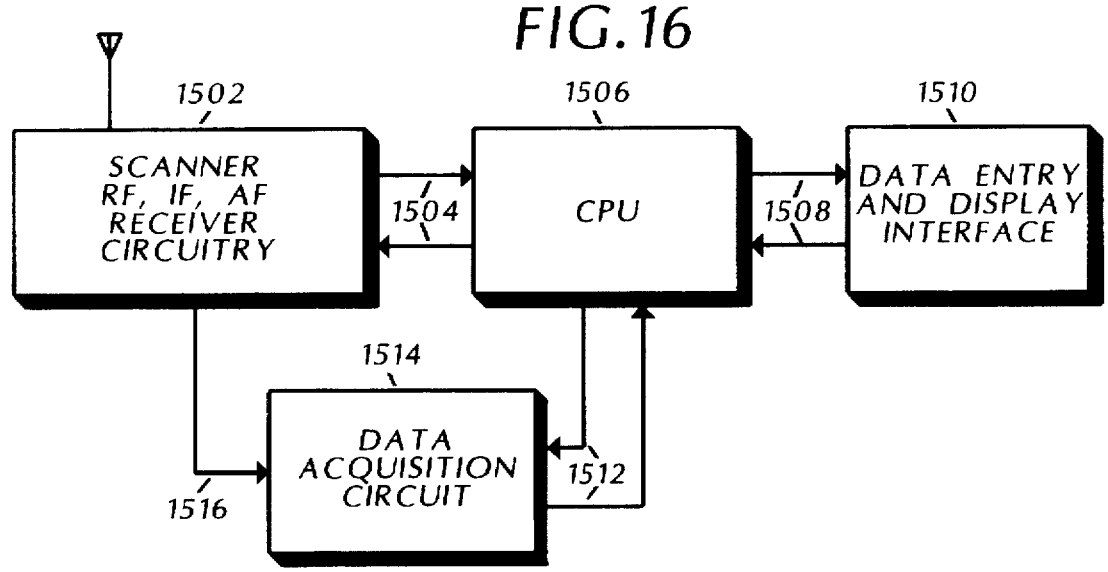
Figure 17:
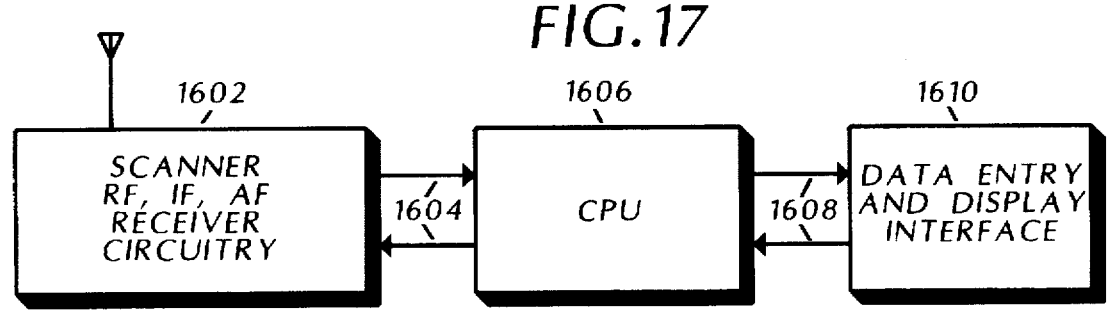

FIGS. 15-17 illustrate several hardware configurations which may advantageously exploit the present invention. Referring now to FIG. 15, there is shown an implementation of the present invention embodied in a system of separate components including a communications receiver 1402, a data acquisition circuit 1406, and a general purpose computer 1410. The data acquisition circuit 1406 may be installed internal to the computer 1410, or it may reside external to the computer. A discriminator output 1404 of the receiver 1402 is received by the data acquisition circuit 1406. The data acquisition circuit performs a low pass filter operation on discriminator output 1404, implements comparator/limiter 304, data sampler 306 of FIG. 11, input 72 of FIG. 7A, and buffers data prior to transferring it to the computer 1410. Additionally, data acquisition circuit 1406 is capable of responding to commands from the computer 1410, causing it to vary the bandwidth of the low pass filter function to accommodate either the subaudible handshake signal or the control channel signal. The computer 1410 implements the remaining elements of the present invention in software. The computer has a data transfer means 1408, supporting data transfer both to and from the computer, allowing it to receive buffered data and to control the bandwidth of the lowpass filter in data acquisition circuit 1406. A serial port output 1412 of computer 1410 causes the receiver 1402 to be tuned to either a voice channel or the control channel as appropriate.

Referring now to FIG. 16, there is shown an implementation of the present invention embodied in a self-contained system comprising a typical scanner type radio receiver. The conventional functional blocks of such a radio include the receiver's RF, IF and AF circuitry 1502, a CPU (central processing unit) 1506 and a data entry and display device 1510. The CPU 1506 and data entry and display device 1510 perform the same function as the computer 1410 in FIG. 15. In general, a portion of the scanner circuitry 1502 is controlled by CPU 1506 via data transfer lines 1504, supporting data transfer both to and from the CPU, in response to commands from data entry and display device 1510 and data received from receiver circuitry 1502. The functionality embodied in FIG. 15 may be added to a conventional scanner type receiver through the addition of data acquisition circuit 1514 to the circuitry of the scanner. Additionally, the functions performed in software by computer 1410 in FIG. 15 are performed in software by CPU 1506. The data acquisition circuit 1514 is identical in function to data acquisition circuit 1406. The receiver supplies a discriminator output 1516 to data acquisition circuit 1514, and data and control signals are passed via data transfer lines 1512, supporting data transfer in both directions, between CPU 1506 and data acquisition circuit 1514 in the same manner as in FIG. 15.

Referring now to FIG. 17, there is shown an implementation of the present invention embodied in a self-contained system comprising a typical scanner type radio receiver similar to FIG. 15, but without the data acquisition circuit 1514. In this embodiment, the data transfer function of data acquisition circuit 1514 in FIG. 16 is performed by a CPU 1606. Receiver RF, IF and AF circuitry 1602 and data entry and display device 1610 correspond to receiver circuitry 1502 and device 1510, respectively, in FIG. 16. The subaudible handshake detection function shown in FIG. 11 and described above, which is responsible for determining if a conversation is in progress on an assigned voice channel, is not implemented in this embodiment. Rather, this function is performed through the conventional squelch detect circuitry present in every scanner. Squelch status information is passed from receiver circuitry 1602 to the CPU 1606 via data transfer lines 1604, supporting data transfer both to and from the CPU. This implementation will work adequately with most trunked dispatch systems compatible with the present invention. It will cause a delay in returning the receiver to the control channel in the case of a trunked dispatch system, which leaves the carrier in place for a short period after the voice channel has been vacated.

While embodiments of the present invention have been shown and described, it will be obvious to those skilled in the art that changes and modifications may be made without departing from the invention in its broader aspects, and, therefore, the aim of the appended claims is to cover all such changes and modifications as fall within the true spirit and scope of the invention.

What is claimed is:

1. In a data communications system for the transmission and reception of a data bit stream including information bits interleaved with error checking bits, a decoder for receiving and processing said data bit stream to recover information impressed thereon, said decoder comprising;

bit de-interleave means for receiving said data bit stream and producing a de-interleaved bit stream corresponding to a subset of the bit stream;

decoder storage means for storing a predetermined sequence of autosynchronization bits, the predetermined sequence of autosynchronization bits corresponding to a subset of the autosynchronization bits impressed on said data bit stream;

decoder combining means for combining said de-interleaved bit stream with said predetermined sequence of autosynchronization bits to provide recovered information bits;

error detector storage means for storing a predetermined subset of the possible messages capable of being encoded in said data bit stream; and error detector means for indicating the presence of errors in the recovered information bits, said error detector means further indicating the presence of one of the predetermined subset of the possible messages capable of being encoded in said data bit stream.

2. The decoder of claim 1, wherein said de-interleave means includes means for receiving a 76 bit data sequence; wherein if the consecutive elements of said 76 bit sequence are labeled $I_0, I_2, I_4$, through $I_{36}$; $P_0, P_2, P_4$, through $P_{36}$; $I_1, I_3, I_5$, through $P_{37}$; $P_1, P_3, P_5$, through $P_{37}$; said de-interleave means generates the sequence $I_0, I_1, I_2$, through $I_{26}$; said sequence of autosynchronization bits comprising 27 bits; wherein if the consecutive elements of said stored autosynchronization sequence are labeled $A_0$ through $A_{26}$, said combiner means generates a sequence $D_0, D_1, D_2$, through $D_{26}$, the result of a modulo-2 sum of the corresponding elements of $A_0$, through $A_{26}$ and said sequence $I_0, I_1, I_2$, through $I_{26}$.

3. The decoder of claim 2, wherein said predetermined subset of the plurality of possible messages capable of being encoded by said data bit stream includes N digital words at least 10 bits wide, where N is at least the number of channels assigned to said data communication system; and wherein the existence of an error is asserted by said error detector means if the digital word comprising the consecutively ordered elements $D_{17}$ through $D_{26}$, selected from said sequence $D_0, D_1, D_2$, through $D_{26}$, is not a member of the set comprised of said N digital words.

4. The decoder of claim 2, wherein said predetermined subset of the plurality of possible messages capable of being encoded by said data bit stream includes N digital words at least 10 bits wide, where N is at least the number of channels assigned for use by said communications system; and wherein the digital word comprising the consecutively ordered elements $D_0$ through $D_{15}$, selected from said sequence $D_0, D_1, D_2$, through $D_{26}$ is assumed to encode an ID code if the digital word comprising the consecutively ordered elements $D_{17}$ through $D_{26}$, selected from said sequence $D_0, D_1, D_2$, through $D_{26}$, is a member of the set comprising said N digital words; whereby a receiver may be made to distinguish between ID codes and spurious data encoded by said consecutively ordered elements $D_0$ through $D_{15}$.

5. The decoder of claim 1, wherein said predetermined sequence of autosynchronization bits is identical to the sequence impressed on said data bit stream and wherein said error detector means comprises a cyclic block decoder.

6. A method for decoding and error checking digital messages encoded into a data bit stream including information bits interleaved with error checking bits, comprising the steps of:

bit de-interleaving a predetermined subset of said encoded data bit stream and discarding the remainder to produce a de-interleaved bit stream;

combining said de-interleaved bit stream and a predetermined sequence of autosynchronization bits, comprising a subset of the autosynchronization bits impressed on said data bit stream, to remove said impressed autosynchronization bits from said de-interleaved bit stream, thereby yielding the information bits of a digital message; and detecting the presence of error in said digital message by comparing said digital message to a predetermined valid set of messages, said valid set of messages comprising a subset of the possible messages capable of being encoded in said digital message, error being asserted if said digital message is not a member of said predetermined valid set of messages.

7. The method of claim 6, wherein said encoded data bit stream includes a total of 76 bits and wherein;

the step of bit de-interleaving, if the consecutive elements of said 76 bit sequence are labeled $I_0, I_2, I_4$, through $I_{36}$; $P_0, P_2, P_4$, through $P_{36}$; $I_1, I_3, I_5$, through $I_{37}$; $P_1, P_3, P_5$, through $P_{37}$; produces the sequence $I_0, I_1, I_2$, through $I_{26}$;

the step of combining the de-interleaved bit stream and the predetermined sequence of autosynchronization bits, $A_0$ through $A_{26}$, includes a step of modulo-2 addition of the corresponding elements of $A_0$ through $A_{26}$ and said sequence $I_0, I_1, I_2$, through $I_{26}$, recovering said digital message; and the step of detecting the presence of error in said digital message, $D_0$ through $D_{26}$, includes a step of comparing the digital word comprising the elements $D_{17}$ through $D_{26}$ of said recovered digital message to said predetermined set of valid messages, producing an indication of error if said recovered digital message is not a member of the set of said predetermined valid messages.

8. In a system for receiving transmissions of a dispatch trunked radio system employing both a control channel to transmit information in the form of outbound signal words and a subaudible handshake signal transmitted on an assigned voice channel, a decoder for detecting the presence of said subaudible handshake signal on said assigned voice channel, comprising:

comparator means for converting a continuous analog waveform applied to said comparator means to a binary valued digital signal;

sampling means for producing a plurality of sample values of said digital signal, said sampling means generating said sample values at a predetermined rate;

pattern matching means for finding instances of sequences of like valued binary bits of predetermined length in said plurality of sample values and producing a count of the number of said instances of sequences of like valued binary bits; and discriminator means for indicating that said subaudible handshake signal is present on said assigned voice channel when said count exceeds a predetermined value.

9. The decoder of claim 8, wherein said pattern matching means produces a count of the number of said instances of sequences of all 1s, and further produces a count of the number of said instances of sequences of all 0s; and wherein said discriminator means indicates that said subaudible handshake signal is present on said assigned voice channel when said count of 1s and said count of 0s satisfies a predetermined relationship.

10. A method for discriminating between the presence, at a point in a circuit, of a deterministic signal waveform and a random noise waveform, said deterministic signal exhibiting a maximum zero-crossing rate substantially less than the average zero-crossing rate exhibited by said random noise waveform, comprising the steps of:

comparing a continuous waveform to a predetermined comparison value to produce a binary valued digital waveform; wherein said digital waveform may assume one of two possible states, selected from the group consisting of the states 0 and 1, said digital waveform assuming state 1 while said continuous waveform exceeds said comparison value, and state 0 while said comparison value is not exceeded, sampling said digital waveform to produce a sequence of samples;

searching for instances of sequences of like valued samples of predetermined length in said sequence of samples to produce a count of the number of said instances of sequences of like valued samples;

comparing said count to a predetermined threshold value; and indicating the presence of said deterministic signal waveform at said circuit point when said count exceeds said predetermined threshold value.

11. The method of claim 10, wherein said deterministic signal waveform comprises a subaudible handshake signal.

12. The method of claim 10, wherein said sequence of samples is searched for instances of sequences of like valued samples of predetermined length in said sequence of samples to produce a count of the number of said instances of sequences of all 1s, and further produces a count of the number of said instances of sequences of all 0s, wherein the step of comparing said count to a predetermined threshold value is accomplished by determining if said count of 1s and said count of 0s satisfies a predetermined relationship; and wherein the step of indicating the presence of said deterministic signal waveform at said circuit point occurs when said predetermined relationship is satisfied.

13. A radio receiver system comprising:

a radio receiver having a receive frequency that is controllable among a control channel and a plurality of voice channels;

a first decoder for decoding a data bit stream received on said control channel and detecting the presence of one of a predetermined subset of the possible messages capable of being encoded in said data bit stream, said data bit stream containing a voice channel message indicative of a voice channel of said plurality of voice channels for operation of said receiver;

means responsive to said voice channel message for operating said receiver on the voice channel indicated by said voice channel message;

a second decoder for detecting a subaudible signal received on said voice channel, said subaudible handshake signal containing a tone burst indicative of a command to return to the control channel; and means responsive to said tone burst for operating said receiver on said control channel.

14. A radio receiver system as defined in claim 13 wherein said data bit stream includes information bits interleaved with error checking bits and wherein said first decoder comprises:

bit de-interleave means for receiving said data bit stream and producing a de-interleaved bit stream corresponding to a subset of the bit stream;

decoder storage means for storing a predetermined sequence of autosynchronization bits, the predetermined sequence of autosynchronization bits corresponding to a subset of the autosynchronization bits impressed on said data bit stream;

decoder combining means for combining said de-interleaved bit stream with said predetermined sequence of autosynchronization bits to provide recovered information bits;

error detector storage means for storing a predetermined subset of the possible messages capable of being encoded in said data bit stream; and error detector means for indicating the presence of errors in the recovered information bits, said error detector means further indicating the presence of one of the predetermined subset of the possible messages capable of being encoded in said data bit stream.

15. A radio receiver system as defined in claim 13 wherein said second decoder comprises:

comparator means for converting a continuous analog waveform applied to said comparator means to a binary valued digital signal;

sampling means for producing a plurality of sample values of said digital signal, said sampling means generating said sample values at a predetermined rate;

pattern matching means for finding instances of sequences of like valued binary bits of predetermined length in said plurality of sample values, said pattern matching means producing a count of the number of said instances of sequences of like valued binary bits; and discriminator means for indicating that said subaudible handshake signal is present on said assigned voice channel when said count exceeds a predetermined value.

16. A radio receiver system as defined in claim 13 wherein said second decoder comprises:

comparator means for converting a continuous analog waveform applied to said comparator means to a binary valued digital signal;

sampling means for producing a plurality of sample values of said digital signal, said sampling means generating said sample values at a predetermined rate;

pattern matching means for finding instances of sequences of like valued binary bits of predetermined length in said plurality of sample values, said pattern matching means producing a count of the number of said instances of sequences of all 1s, and further producing a count of the number of said instances of sequences of all 0s; and discriminator means for indicating that said subaudible handshake signal is present on said assigned voice channel when said count of 1s and said count of 0s satisfies a predetermined relationship.

17. A radio receiver system as defined in claim 13 further comprising a microprocessor for controlling said system, wherein said first decoder is implemented in said microprocessor.

18. A radio receiver system as defined in claim 13 wherein said radio receiver system comprises a scanner radio receiver and wherein said data bit stream comprises outbound signal words from a dispatch trunked radio system.

19. In a system for receiving transmissions of a dispatch trunked radio system employing both a control channel to transmit information in the form of outbound signal words and a subaudible handshake signal transmitted on an assigned voice channel, a method for detecting the presence of the subaudible handshake signal on the assigned voice channel, comprising the steps of:

converting the continuous analog waveform received on the assigned voice channel to a binary valued digital signal;

sampling said digital signal at a predetermined rate to provide a plurality of sample values of said digital signal;

finding instances of sequences of like valued binary bits of predetermined length in the plurality of sample values and producing a count of the number of said instances of sequences of like valued binary bits; and indicating that said subaudible handshake signal is present on said assigned voice channel when said count exceeds a predetermined value.

20. In a system for receiving transmissions of a dispatch trunked radio system employing both a control channel to transmit information in the form of outbound signal words and a subaudible handshake signal transmitted on an assigned voice channel, a method for detecting the presence of the subaudible handshake signal on the assigned voice channel, comprising the steps of:

converting the continuous analog waveform received on the assigned voice channel to a binary valued digital signal;

sampling said digital signal at a predetermined rate to provide a plurality of sample values of said digital signal; finding instances of sequences of like valued binary bits of predetermined length in the plurality of sample values and producing a count of the number of said instances of sequences of all 1s, and further producing a count of the number of said instances of sequences of all 0s; and indicating that said subaudible handshake signal is present on said assigned voice channel when said count of 1s and said count of 0s satisfies a predetermined relationship.

21. A radio receiver system comprising:

a radio receiver having a receive frequency that is controllable among a control channel and a plurality of voice channels, said radio receiver including squelch circuitry;

a decoder for decoding a data bit stream received on said control channel and detecting the presence of one of a predetermined subset of the possible messages capable of being encoded in said data bit stream, said data bit stream containing a voice channel message indicative of a voice channel of said plurality of voice channels for operation of said receiver;

means responsive to said voice channel message for operating said receiver on the voice channel indicated by said voice channel message; and said squelch circuitry detecting the presence of a signal on said voice channel and causing said receiver to return to the control channel in the absence of such signal.

* * * * *